US012250798B2

United States Patent
Chung et al.

(10) Patent No.: US 12,250,798 B2
(45) Date of Patent: Mar. 11, 2025

(54) ELECTRONIC DEVICE INCLUDING HEAT DISSIPATION SHEET

(71) Applicant: SAMSUNG ELECTRONICS CO., LTD., Suwon-si (KR)

(72) Inventors: Haein Chung, Suwon-si (KR); Kyungha Koo, Suwon-si (KR); Kangsik Kim, Suwon-si (KR); Wonmin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 216 days.

(21) Appl. No.: 17/975,169

(22) Filed: Oct. 27, 2022

(65) Prior Publication Data

US 2023/0039881 A1    Feb. 9, 2023

Related U.S. Application Data

(63) Continuation of application No. PCT/KR2021/004854, filed on Apr. 19, 2021.

(30) Foreign Application Priority Data

Apr. 29, 2020    (KR) .................. 10-2020-0052299

(51) Int. Cl.
*H05K 7/20* (2006.01)
*F16F 15/04* (2006.01)
*H04M 1/02* (2006.01)

(52) U.S. Cl.
CPC ......... *H05K 7/20963* (2013.01); *F16F 15/04* (2013.01); *H04M 1/026* (2013.01); *F16F 2224/0225* (2013.01)

(58) Field of Classification Search
CPC ............ H05K 7/20336; H05K 7/2039; H05K 7/2048; H05K 7/205; H05K 7/20963;
(Continued)

(56) References Cited

U.S. PATENT DOCUMENTS 6,147,866 A    11/2000  Saito et al.
6,501,644 B1 *  12/2002  Silverman .............. G11B 33/08
                                                                361/679.36

(Continued)

FOREIGN PATENT DOCUMENTS

JP    2000-031674 A    1/2000
JP    2002-352575 A    12/2002
(Continued)

OTHER PUBLICATIONS

Communication dated Jul. 11, 2023, issued by the European Patent Office in European Application No. 21796667.0.
(Continued)

*Primary Examiner* — Amir A Jalali
(74) *Attorney, Agent, or Firm* — Sughrue Mion, PLLC

(57) ABSTRACT

An electronic device includes a first electrical element, a heat dissipation sheet having a heat diffusion member for diffusing the heat generated from the first electrical element, and an anti-shock member arranged to be stacked with at least a part of the heat diffusion member; and a bracket which provides a space for accommodating the heat dissipation sheet. The heat dissipation sheet includes a first area, a second area, and a third area arranged between the first area and the second area.

19 Claims, 14 Drawing Sheets

(58) Field of Classification Search
CPC ..... H05K 1/0203–0204; H05K 5/0018; H05K 5/04; H05K 9/0026; H05K 2201/10128; H04M 1/026; H04M 1/0268; F16F 15/04; F16F 2224/0225; B23K 2101/36; G06F 1/203; G06F 1/1626

See application file for complete search history.

(56) References Cited

U.S. PATENT DOCUMENTS

| | | | |
|---|---|---|---|
| 9,116,674 | B2 * | 8/2015 | Merz .................... G06F 1/1637 |
| 9,986,072 | B2 | 5/2018 | Lee et al. |
| 11,304,337 | B2 | 4/2022 | Lee et al. |
| 2004/0032710 | A1 * | 2/2004 | Fujiwara ............... G06F 1/1616 |
| 2005/0180113 | A1 * | 8/2005 | Shirakami ........... F28D 15/0233 257/E23.09 |
| 2006/0098412 | A1 * | 5/2006 | Kim .................... H05K 7/20963 361/704 |
| 2006/0187644 | A1 | 8/2006 | Jeong |
| 2010/0027220 | A1 * | 2/2010 | Hughes ............. H05K 7/20445 361/702 |
| 2010/0142154 | A1 | 6/2010 | Collet et al. |
| 2016/0100508 | A1 | 4/2016 | Kim et al. |
| 2018/0007181 | A1 | 1/2018 | Lee et al. |
| 2018/0288908 | A1 * | 10/2018 | Lee ........................ H05K 9/003 |
| 2019/0073505 | A1 * | 3/2019 | Kwon .................... H05K 1/028 |
| 2019/0196589 | A1 | 6/2019 | Shim et al. |
| 2019/0364695 | A1 * | 11/2019 | Lee .................... H05K 7/20336 |
| 2019/0393433 | A1 * | 12/2019 | Dagn ..................... H01L 25/18 |
| 2020/0100390 | A1 * | 3/2020 | Koo .................... F28D 15/0233 |
| 2020/0178415 | A1 * | 6/2020 | Kim ....................... H05K 1/181 |
| 2020/0196496 | A1 * | 6/2020 | Shin ...................... G06F 1/1652 |
| 2020/0367383 | A1 | 11/2020 | Moon et al. |
| 2021/0092528 | A1 * | 3/2021 | Lee ........................ H04R 1/028 |
| 2021/0274637 | A1 | 9/2021 | Kim et al. |
| 2022/0322516 | A1 * | 10/2022 | Kim ........................ H02J 50/12 |

FOREIGN PATENT DOCUMENTS

| | | |
|---|---|---|
| JP | 2006-235564 A | 9/2006 |
| JP | 2009-111171 A | 5/2009 |
| JP | 2016-42582 A | 3/2016 |
| KR | 10-2016-0009914 A | 1/2016 |
| KR | 10-2016-0096927 A | 8/2016 |
| KR | 10-2019-0047154 A | 5/2019 |
| KR | 10-2019-0060074 A | 6/2019 |
| KR | 10-2019-0076656 A | 7/2019 |
| KR | 10-2019-0101640 A | 9/2019 |
| KR | 10-2020-0011183 A | 2/2020 |

OTHER PUBLICATIONS

Communication dated Mar. 5, 2024, issued by the European Patent Office in counterpart European Application No. 21796667.0.

International Searching Report (PCT/ISA/210) issued Jul. 29, 2021 by the International Searching Authority for International Patent Application No. PCT/KR2021/004854.

Written Opinion International Searching Report (PCT/ISA/237) issued Jul. 29, 2021 by the International Searching Authority for International Patent Application No. PCT/KR2021/004854.

Communication dated Aug. 19, 2024, issued by the Korean Intellectual Property Office in Korean Patent Application No. 10-2020-0052299.

* cited by examiner

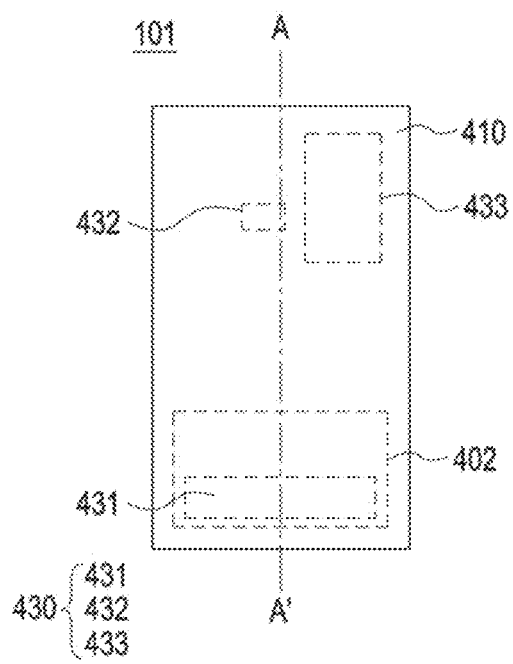
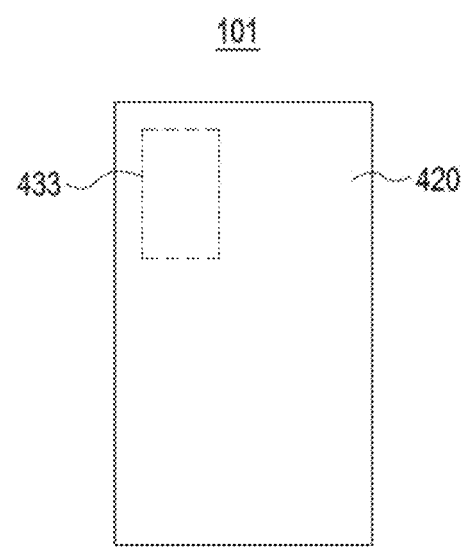
FIG. 6A  FIG. 6B
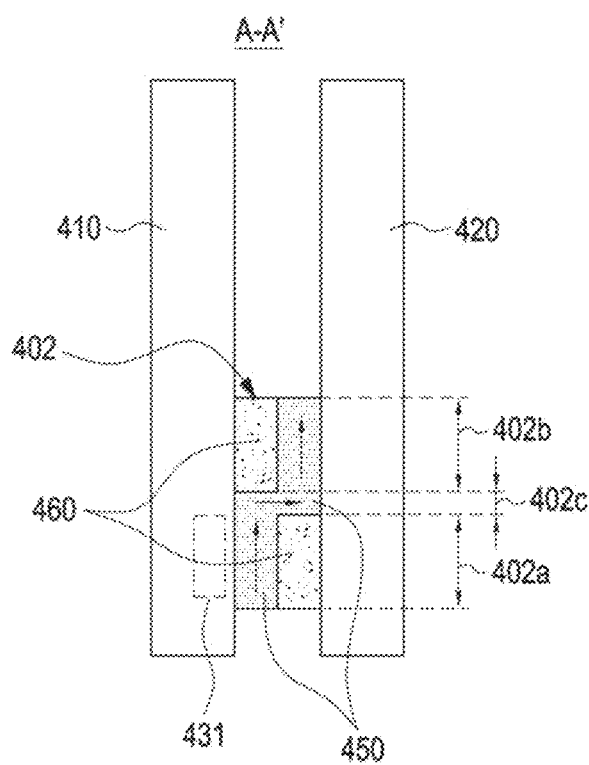
FIG. 7

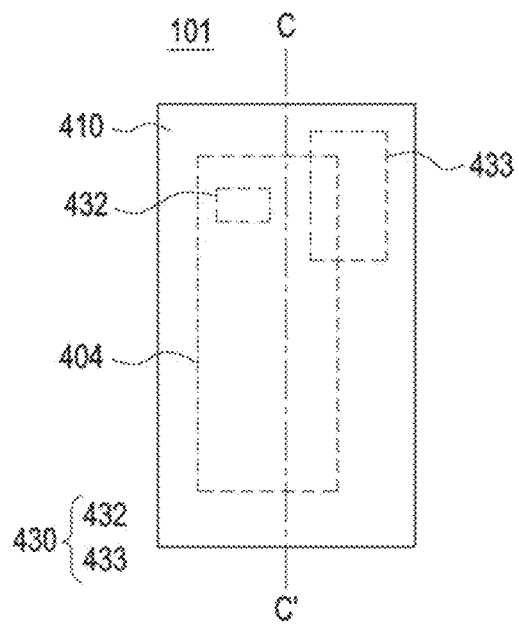 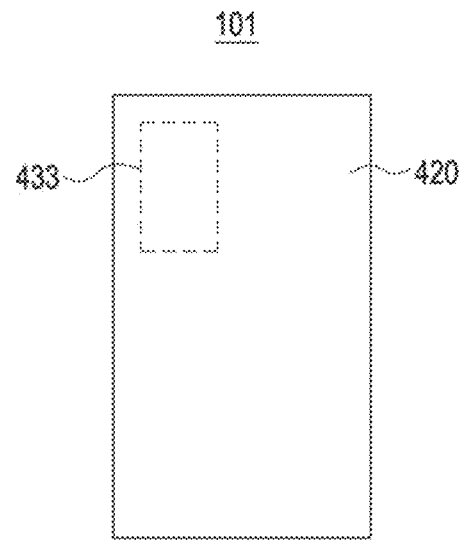
FIG. 10A  FIG. 10B
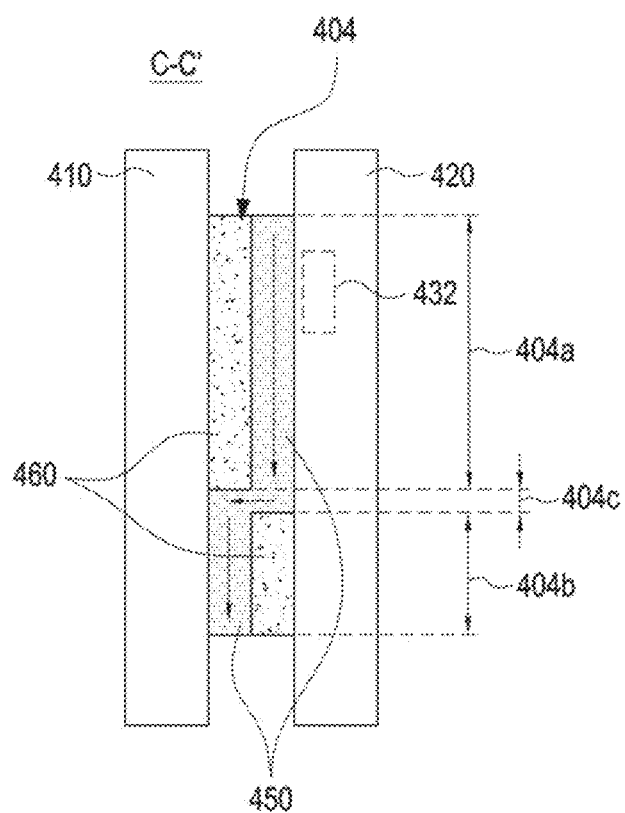
FIG. 11

ELECTRONIC DEVICE INCLUDING HEAT DISSIPATION SHEET

CROSS-REFERENCE TO RELATED APPLICATION(S)

This application is a bypass continuation application of international application No. PCT/KR2021/004854, filed on Apr. 19, 2021, which claims priority to Korean Patent Application No. 10-2020-0052299, filed on Apr. 29, 2020, in the Korean Intellectual Property Office, the disclosure of which is incorporated by reference herein in its entirety.

BACKGROUND

1. Field

Various embodiments of the disclosure relate to a heat dissipation sheet for protecting electronic components disposed in an electronic device from external impact and efficiently dissipating heat and an electronic device including the same.

2. Description of Related Art

Advancing information communication and semiconductor technologies accelerate the spread and use of various electronic devices. In particular, recent electronic devices are being developed to carry out communication while carried on.

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

In general, a printed circuit board (PCB) and various electronic components mounted on the printed circuit board are disposed inside an electronic device. Some circuit elements constituting the electric components generate electromagnetic waves and/or heat which may cause a malfunction and performance deterioration of the electronic device.

In general, a heat diffusion structure disposed in an electronic device may increase surface heat generation by disposing heat sources (e.g., circuit elements) close to a surface of the electronic device. However, some heat sources may concentrate heat on one area of the display surface, causing localized heating problems. Further, to reduce the thermal resistance between the shock-sensitive display and the inside of the electronic device, a solid-state intermediate medium (e.g., thermal interface material (TIM)) may be disposed. However, the placement structure of the intermediate medium may cause damage due to degradation of impact resistance of the electronic device.

SUMMARY

According to various embodiments of the disclosure, there may be provided a heat dissipation sheet that may efficiently radiate the heat generated from at least one electrical element to the outside of the electronic device and absorb an externally applied shock and an electronic device including the same.

According to various embodiments of the disclosure, an electronic device may include a first electrical element; a heat dissipation sheet including a heat diffusion member and an anti-shock member disposed to be stacked with at least a portion of the heat diffusion member; and a bracket providing a space for receiving the heat dissipation sheet, the bracket including a first area corresponding to the first electrical element, a second area spaced apart from the first area, and a third area disposed between the first area and the second area, wherein in the first area, a first portion of the heat diffusion member is disposed to face in a first direction, and a first portion of the anti-shock member is disposed to face in a second direction opposite to the first direction, wherein in the second area, a second portion of the heat diffusion member is disposed to face in the second direction, and a second portion of the anti-shock member is disposed to face in the first direction, and wherein a third portion of the heat diffusion member disposed in the third area extends from the heat diffusion member in the first area and connects to the heat diffusion member in the second area.

The heat diffusion member may include a first diffusion portion having a first size and a second diffusion portion having a second size larger than the first size, and wherein the first diffusion portion may be disposed nearer to the first electrical element than the second diffusion portion.

The electronic device may include a display assembly having at least a portion exposed to an outside in the first direction, wherein the first electrical element may include a display driver IC (DDI) configured to drive the display assembly.

The heat dissipation sheet may be disposed between the display assembly and the bracket, and wherein a first diffusion portion of the heat diffusion member disposed in the first area of the bracket may be in contact with the first electrical element.

A second diffusion portion of the heat diffusion member disposed in the second area of the bracket may be disposed adjacent to the bracket.

The heat diffusion member may include at least a portion forming a stepped shape, the heat diffusion member may include at least one material among graphite, carbon nanotubes, a natural renewable material, silicone, and silicon.

The heat dissipation sheet may include a first flat surface facing in the first direction and a second flat surface facing in the second direction, wherein the first flat surface may be formed as the heat diffusion member disposed in the first area and the third area and the anti-shock member disposed in the second area are arranged side by side, and wherein the second flat surface may be formed as the heat diffusion member, disposed in the second area and the third area, and the anti-shock member disposed in the first area are arranged side by side.

The electronic device may include a sheet disposed on the first surface or the second surface, wherein the sheet includes at least one of an adhesive member or a release sheet.

A size of a first member of the anti-shock member, disposed in the first area of the bracket, corresponds to a size of the first diffusion portion, wherein a size of a second member of the anti-shock member, disposed in the second area of the bracket, corresponds to a size of the second diffusion portion, and wherein the first member and the second member are spaced apart from each other.

The anti-shock member may include a first member and a second member, and wherein the first member and the second member are spaced apart from each other on opposite sides of the third diffusion member.

The anti-shock member may be larger in thickness than the heat diffusion member, and wherein the anti-shock member may include a foam material.

Heat generated from the first electrical element may be transferred to the first diffusion portion, diffused to the second diffusion portion through the third diffusion portion, and provided to the bracket, and wherein, of the heat generated from the first electrical element, the heat provided to an inside of the electronic device through the heat dissipation sheet may be greater than the heat provided to a surface of the display assembly.

The electronic device may include a printed circuit board disposed under the bracket; and a second electrical element mounted on the printed circuit board, wherein the second electrical element may be adjacent to the heat diffusion member in the second area.

The electronic device may include at least one heat conduction sheet disposed between the second electrical element and the bracket, wherein the heat conduction sheet includes at least one of a heat pipe, a copper plate, and a vapor chamber.

According to various embodiments of the disclosure, an electronic device may include a display having at least a portion exposed toward a front surface, a printed circuit board disposed to face the display, at least one electrical element electrically connected with the printed circuit board, a heat dissipation sheet having at least a portion disposed adjacent to the electrical element and including a heat diffusion member and an anti-shock member disposed to be stacked with the heat diffusion member, and a bracket for providing a space to seat at least a portion of the heat dissipation sheet. The heat diffusion member may include a first portion forming a first area and a second portion forming a second area larger than the first area. The first portion may be disposed adjacent to the display, and the second portion may be disposed adjacent to the bracket.

According to various embodiments of the disclosure, the heat dissipation sheet may include a heat diffusion member disposed adjacent to at least one electrical element to diffuse heat generated from the at least one electrical element and an anti-shock member disposed to be stacked with at least a portion of the heat diffusion member. The first diffusion portion of the heat diffusion member may be disposed to face in the first direction toward the at least one electrical element, the first member of the anti-shock member may be disposed to face in the second direction opposite to the first direction, the second diffusion portion of the heat diffusion member may be disposed to face in the second direction, the second member of the anti-shock member may be disposed to face in the first direction, and the third diffusion portion of the heat diffusion member may extend from the first diffusion portion of the heat diffusion member and connect to the second diffusion portion of the heat diffusion member.

According to various embodiments of the disclosure, the electronic device may provide a heat dissipation sheet including a shock mitigation function and/or a heat dissipation function.

According to various embodiments of the disclosure, the heat dissipation sheet may include a heat diffusion member having thermal conductivity and/or an anti-shock member disposed adjacent to the heat diffusion member. The heat diffusion member may be attached to the heat source and/or the heat conduction sheet to perform a heat dissipation function, and the anti-shock member may be formed to be joined with the heat diffusion member and to surround at least a portion of the heat diffusion member to effectively absorb external impact.

According to various embodiments of the disclosure, the heat diffusion member and the anti-shock member constituting the heat dissipation sheet may be formed by joining to provide a substantially uniform surface as a whole. Accordingly, it is possible to easily attach to the release paper and to enhance assembly in the electronic device.

Effects of the disclosure are not limited to the foregoing, and other unmentioned effects would be apparent to one of ordinary skill in the art from the following description.

BRIEF DESCRIPTION OF THE DRAWINGS

FIG. 6A is a see-through view related to a display and an internal component as viewed from the front of an electronic device according to an embodiment of various embodiments of the disclosure; FIG. 6B is a see-through view related to a bracket and an internal component as viewed from the rear of an electronic device;

FIG. 7 is a cross-sectional view taken along A-A' of the electronic device structure of FIGS. 6A and 6B;

FIG. 10A is a see-through view illustrating a display and an internal component as viewed from the front of an electronic device according to an embodiment of various embodiments of the disclosure; FIG. 10B is a see-through view related to a bracket and an internal component as viewed from the rear of an electronic device;

FIG. 11 is a cross-sectional view taken along C-C' of the electronic device structure of FIGS. 10A and 10B;

DETAILED DESCRIPTION

Figure 1:
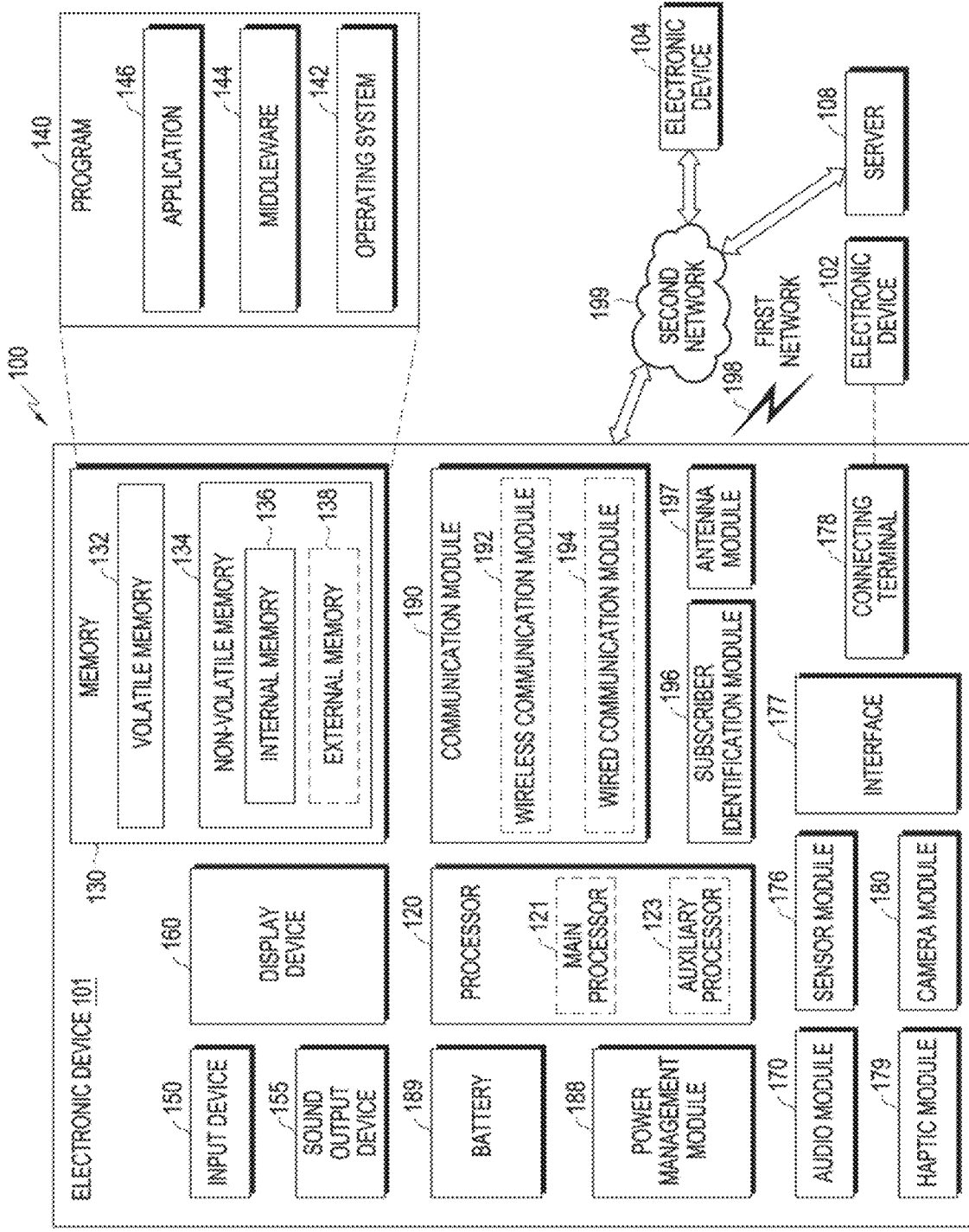
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module may include one antenna including a radiator formed of a conductor or conductive pattern formed on a substrate (e.g., a printed circuit board (PCB)). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example. The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
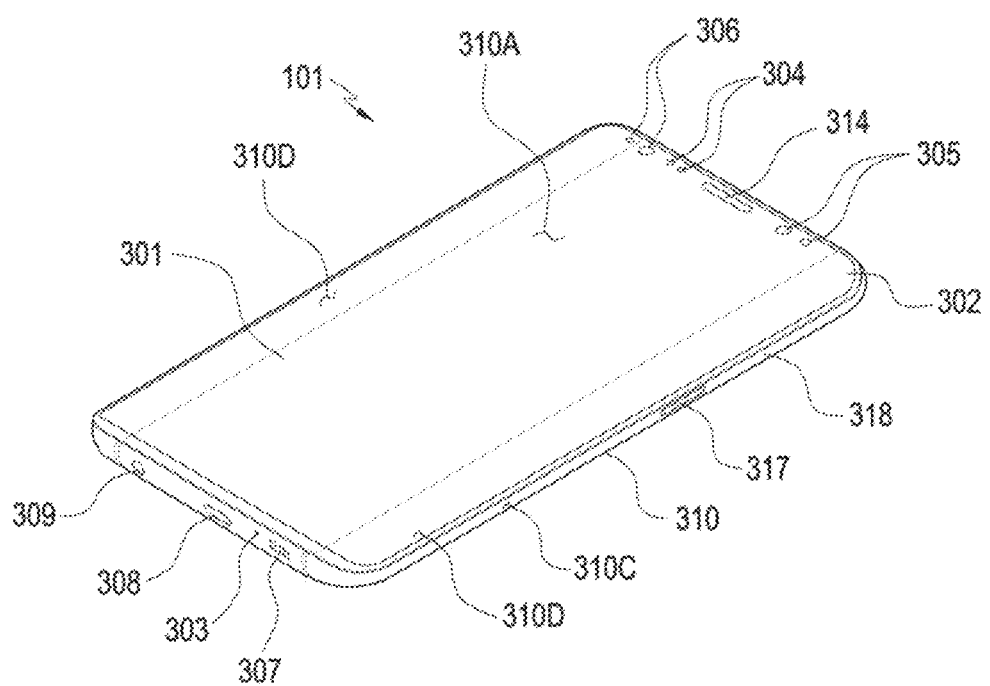
FIG. 2 is a front perspective view illustrating an electronic device according to various embodiments of the disclosure.
Figure 3:
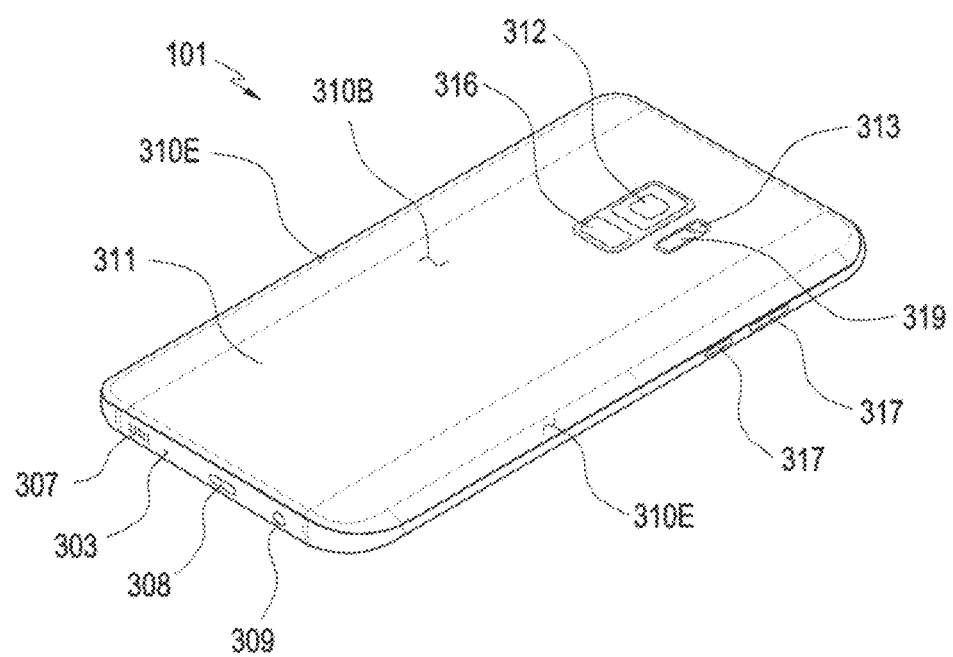
FIG. 3 is a rear perspective view illustrating an electronic device according to various embodiments of the disclosure.

FIG. 2 is a front perspective view illustrating an electronic device according to various embodiments of the disclosure;

FIG. 3 is a rear perspective view illustrating an electronic device according to various embodiments of the disclosure;

Referring to FIGS. 2 and 3, according to an embodiment, an electronic device 101 may include a housing 310 with a first (or front) surface 310A, a second (or rear) surface 310B, and a side surface 310C surrounding a space between the first surface 310A and the second surface 310B. According to another embodiment (not shown), the housing may denote a structure forming part of the first surface 310A, the second surface 310B, and the side surface 310C of FIG. 2. According to an embodiment, at least part of the first surface 310A may have a substantially transparent front plate 302 (e.g., a glass plate or polymer plate). The second surface 310B may be formed by a rear plate 311 that is substantially opaque. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., a metal, such as aluminum).

In the embodiment illustrated, the front plate 302 may include two first areas 310D, which seamlessly and bendingly extend from the first surface 310A to the rear plate 311, on both the long edges of the front plate 302. In the embodiment (refer to FIG. 3) illustrated, the rear plate 311 may include two second areas 310E, which seamlessly and bendingly extend from the second surface 310B to the front plate, on both the long edges. According to an embodiment, the front plate 302 (or the rear plate 311) may include only one of the first areas 310 (or the second areas 310E). Alternatively, the first areas 310D or the second areas 310E may partially be excluded. According to an embodiment, at side view of the electronic device 101, the side bezel structure 318 may have a first thickness (or width) for sides that do not have the first areas 310D or the second areas 310E and a second thickness, which is smaller than the first thickness, for sides that have the first areas 310D or the second areas 310E.

According to an embodiment, the electronic device 101 may include at least one of a display 301, audio modules 303, 307, and 314 (e.g., the audio module 170 of FIG. 1), sensor modules 304, 316, and 319 (e.g., the sensor module 176 of FIG. 1), camera modules 305 and 312 (e.g., the camera module 180 of FIG. 1), a key input device 317 (e.g., the input device 150 of FIG. 1), a light emitting device 306, and connector holes 308 and 309 (e.g., the connection terminal 178 of FIG. 1). According to an embodiment, the electronic device 101 may exclude at least one (e.g., the key input device 317, connector hole 309, or the light emitting device 306) of the components or may add other components.

According to an embodiment, the display 301 may be visually revealed through, e.g., a majority portion of the front plate 302. According to an embodiment, at least a portion of the display 301 may be exposed through the front plate 302 forming the first surface 310A and the first areas 310D of the side surface 310C. According to an embodiment, the edge of the display 301 may be formed to be substantially the same in shape as an adjacent outer edge of the front plate 302. According to another embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the first surface 310A and/or the first areas 310D of the side surface 310C.

In another embodiment (not shown), a recess or opening may be formed in a portion of the screen display area (e.g., the first surface 310A, and/or the first areas 310D) of the display 301 and there may be included at least one or more of an audio module 314, a sensor module 304, a camera module 305, and a light emitting device 306 aligned with the recess or opening. According to another embodiment (not shown), at least one or more of the audio module 314, sensor module 304, camera module 305, fingerprint sensor 316, and light emitting device 306 may be included on the rear surface of the screen display area of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor modules 304 and/or at least part of the key input device 317 may be disposed in the first areas 310D and/or the second areas 310E.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. In some embodiments, the speaker holes 307 and 314 and the microphone hole 303 may be implemented as a single hole, or a speaker may be included without the speaker holes 307 and 314 (e.g., a piezo speaker). The audio modules 303, 307, and 314 are not limited to the above-described structure. Depending on the structure of the electronic device 101, various design changes may be made—e.g., only some of the audio modules may be mounted, or a new audio module may be added.

According to an embodiment, the sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) disposed on the first surface 310A of the housing 310, and/or a second sensor module (not shown) (e.g., a fingerprint sensor), and/or a third sensor module 319 (e.g., a heart-rate monitor (HRM) sensor) disposed on the second surface 310B of the housing 310, and/or a fourth sensor module 316 (e.g., a fingerprint sensor). The fingerprint sensor may be disposed on the second surface 310A as well as on the first surface 310B (e.g., the display 301) of the housing 310. The electronic device 101 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor. The sensor modules 304, 316, and 319 are not limited to the above-described structure. Depending on the structure of the electronic device 101, various design changes may be made—e.g., only some of the sensor modules may be mounted, or a new sensor module may be added.

According to an embodiment, the camera modules 305 and 312 may include a first camera module 305 disposed on the first surface 310A of the electronic device 101, and a second camera module 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telephoto lens) and image sensors may be disposed on one surface of the electronic device 101. The camera modules 305 and 312 are not limited to the above-described structure. Depending on the structure of the electronic device 101, various design changes may be made—e.g., only some of the camera modules may be mounted, or a new camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may be a front camera and at least another of the plurality of camera modules may be a rear camera. Further, the plurality of camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed, e.g., on the side surface 310C of the housing 310. According to another embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

According to an embodiment, the light emitting device 306 may be disposed on the first surface 310A of the housing 310, for example. The light emitting device 306 may provide, e.g., information about the state of the electronic device 101 in the form of light. According to an embodiment, the light emitting device 306 may provide a light source that interacts with, e.g., the camera module 305. The light emitting device 306 may include, e.g., a light emitting diode (LED), an infrared (IR) LED, or a xenon lamp.

According to an embodiment, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device. The connector holes 308 and 309 are not limited to the above-described structure. Depending on the structure of the electronic device 101, various design changes may be made—e.g., only some of the connector holes may be mounted, or a new connector hole may be added.

According to an embodiment, some 305 of the camera modules 305 and 312 and/or some 304 of the sensor modules 304, 316, and 319 may be disposed to be exposed to the outside through at least a portion of the display 301. For example, the camera module 305 may include a punch hole camera disposed inside a hole or recess formed in the rear surface of the display 301. According to an embodiment, the camera module 312 may be disposed inside the housing 310 so that the lens is exposed to the second surface 310B of the electronic device 101. For example, the camera module 312 may be disposed on a printed circuit board (e.g., the printed circuit board 340 of FIG. 4).

According to an embodiment, the camera module 305 and/or the sensor module 304 may be disposed to contact the external environment through a transparent area from the internal space of the electronic device 101 to the front plate 302 of the display 301. Further, some sensor module 304 may be disposed to perform its functions without being visually exposed through the front plate 302 in the internal space of the electronic device.

Figure 4:
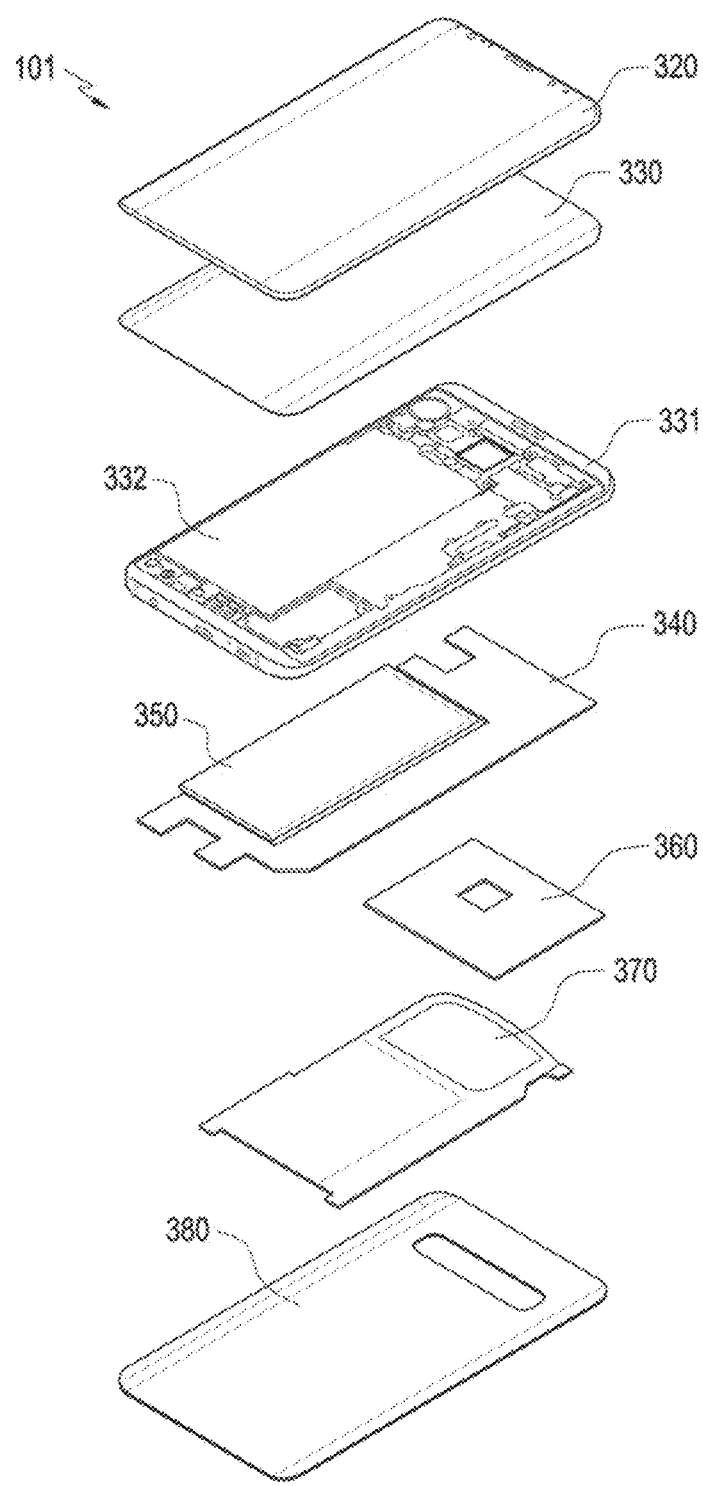
FIG. 4 is an exploded perspective view illustrating an electronic device according to various embodiments of the disclosure.

FIG. 4 is an exploded perspective view illustrating an electronic device according to various embodiments of the disclosure.

Referring to FIG. 4, according to various embodiments, an electronic device 101 (e.g., the electronic device 101 of FIGS. 1 to 3) may include a side bezel structure 331 (e.g., the side bezel structure 318 of FIG. 2), a first supporting member 332 (e.g., bracket), a front plate 320 (e.g., the front plate 302 of FIG. 2), a display 330 (e.g., the display 301 of FIG. 2), a printed circuit board 340 (e.g., a PCB, flexible PCB (FPCB), or rigid flexible PCB (RFPCB)), a battery 350 (e.g., the battery 189 in FIG. 1), a second supporting member 360 (e.g., a rear case), an antenna 370 (e.g., the antenna module 197 of FIG. 1), and a rear plate 380 (e.g., the rear plate 311 of FIG. 2). According to an embodiment, the electronic device 101 may exclude at least one (e.g., the first supporting member 332 or second supporting member 360) of the components or may add other components. At least one of the components of the electronic device 101 may be the same or similar to at least one of the components of the electronic device 101 of FIG. 2 or 3 and no duplicate description is made below.

According to various embodiments, the first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the printed circuit board 340 may be joined onto the opposite surface of the first supporting member 311.

According to various embodiments, a processor, a memory, and/or an interface may be mounted on the printed circuit board 340. The processor may include one or more of, e.g., a central processing unit, an application processor, a graphic processing device, an image signal processing, a sensor hub processor, or a communication processor. According to various embodiments, the printed circuit board 340 may include a flexible printed circuit board type radio frequency cable (FRC). For example, the printed circuit board 340 may be disposed on at least a portion of the first supporting member 332 and may be electrically connected with an antenna module (e.g., the antenna module 197 of FIG. 1) and a communication module (e.g., the communication module 190 of FIG. 1).

According to an embodiment, the memory may include, e.g., a volatile or non-volatile memory.

According to various embodiments, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment, the battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to various embodiments, the second supporting member 360 (e.g., a rear case) may be disposed between the printed circuit board 340 and the antenna 370. For example, the second supporting member 360 may include one surface to which at least one of the printed circuit board 340 and the battery 350 is coupled, and another surface to which the antenna 370 is coupled.

According to an embodiment, the antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 331 and/or the first supporting member 332.

According to various embodiments, the rear plate 380 may form at least a portion of the rear surface (e.g., the second surface 310B of FIG. 3) of the electronic device 101.

Figure 5:
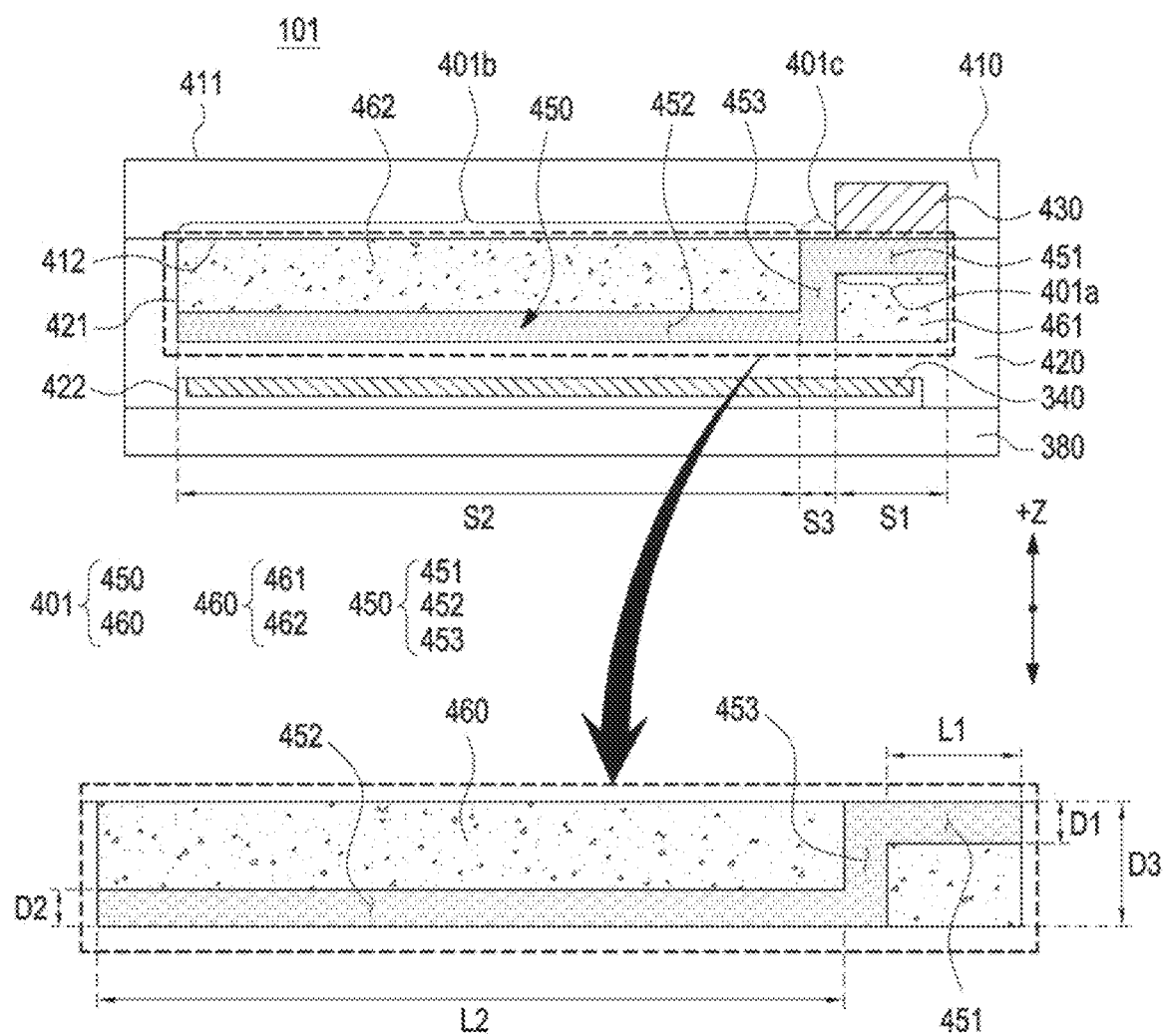
FIG. 5 is a cross-sectional view of an electronic device illustrating a structure for heat dissipation and impact mitigation around an electronic component according to an embodiment of the disclosure.

FIG. 5 is a cross-sectional view of an electronic device illustrating a structure for heat dissipation and impact mitigation around an electronic component according to an embodiment of the disclosure.

According to various embodiments, an electronic device (e.g., the electronic device 101 of FIGS. 1 to 4) may include at least one electrical element 430, a heat dissipation sheet 401, and a bracket 420. According to an embodiment, the electronic device 101 may further include a display assembly 410, a printed circuit board 340, and a rear plate 380. According to an embodiment, the configuration of the display assembly 410 of FIG. 5 may be identical in whole or part to the configuration of the front plate 320 and the display 330 of FIG. 4. The configuration of the printed circuit board 340, the bracket 420 and the rear plate 380 of FIG. 5 may be identical in whole or part to the configuration of the printed circuit board 340, the first supporting member 332 and the rear plate 380 of FIG. 4.

In FIG. 5, 'Z' may mean a thickness direction of the electronic device 101. Further, in an embodiment of the present disclosure, '+Z' may mean a front direction (e.g., a first direction) in which the electrical element 430 disposed in the electronic device faces the display assembly 410, and '−Z' may mean a rear direction (e.g., a second direction) in which the electrical element 430 disposed in the electronic device faces the rear plate 380.

According to various embodiments, the printed circuit board 340 may include a main circuit board and/or a flexible circuit board connected to the display. A plurality of electrical devices may be disposed on the printed circuit board 340. Some electrical elements among the plurality of electrical elements are heat sources that generate heat, and may be at least one chip disposed on the printed circuit board 340. For example, a display driver integrated circuit (DDI) may be disposed on the flexible circuit board. As another example, at least one of a power management integrated circuit (PMIC), a power amplifier (PAM), an application processor (AP), a communication processor (CP), and a charger integrated circuit (IC) may be disposed on the main circuit board.

According to various embodiments, the display assembly 410 may include a display (e.g., the display 330 of FIG. 4), and a transparent plate (e.g., the front plate 320 of FIG. 4) protecting the display and at least partially exposed to the outside. The display assembly 410 may include a first surface 411 facing in the first direction (+Z axis direction) and a second surface 412 facing in the direction opposite to the first direction (+Z axis direction). An electronic component 430 (e.g., DDI) for driving the display may be disposed on the second surface 412 of the display assembly 410. The heat generated from the electrical element 430 may be surface-radiated through the first surface 411 via the inside of the display assembly 410 and be diffused in the internal direction of the electronic device 101.

According to various embodiments, the bracket 420 may provide a space 421 or 422 for supporting the display assembly 410 and receiving the heat dissipation sheet 401 and/or the main circuit board. For example, the space 421 or 422 may be partitioned into a plurality of ones, and the heat dissipation sheet 401 may be received in the first space 421 at least a portion of which is opened in the first direction (+Z axis direction). As another example, the main circuit board may be received in the second space 422 at least a portion of which is opened in the second direction (−Z axis direction) opposite to the first direction (+Z axis direction).

According to an embodiment, the first space 421 of the bracket 420 may be divided into a plurality of areas according to the placement relationship of the heat diffusion member 450 constituting the heat dissipation sheet 401. For example, the first space 421 of the bracket 420 may include a first area S1, a second area S2, and a third area S3. The first area S1 may be an area facing the electrical element 430. The second area S2 may be spaced apart from the first area S1. The third area S3 may be disposed between the first area S1 and the second area S2 to connect the first area S1 and the second area S2. According to an embodiment, the heat generated from the electrical element 430 may be diffused throughout the electronic device 101. For example, the heat generated from the electrical element 430 may be transferred to the bracket 420 through the heat dissipation sheet 401 and may be diffused throughout the electronic device 101.

According to various embodiments, the heat dissipation sheet 401 may be stacked in a plurality of layers. The heat dissipation sheet 401 may include a heat diffusion member 450 for diffusing the heat generated from the electrical element 430 and an anti-shock member 460 disposed to be stacked with at least a portion of the heat diffusion member 450 to protect internal components of the electronic device 101 from external impact. Hereinafter, an embodiment in which the electrical element 430 is a DDI is described.

According to an embodiment, at least a portion of the heat diffusion member 450 may be formed in a stepped shape, and the anti-shock member 460 may be attached to the stepped area of the heat diffusion member 450 so that the heat dissipation sheet 401 is provided as a flat sheet providing an overall substantially uniform surface. For example, the anti-shock member 460 may be disposed in an area of the heat diffusion member 450 to compensate for the stepped shape of the heat diffusion member 450.

According to an embodiment, the heat dissipation sheet 401 may be received in the first space 421 of the bracket 420. The heat dissipation sheet 401 may be divided into a plurality of portions depending on the placement relationship of the heat diffusion member 450. For example, a first portion 401a of the heat dissipation sheet 401 may be disposed in a first area S1 of the bracket 420, and a second portion 401b of the heat dissipation sheet 401 may be disposed in a second area S2 of the bracket 420. As another example, a third portion 401c of the heat dissipation sheet 401 may be disposed in a third area S3 of the bracket 420.

According to an embodiment, the heat diffusion member 450 of the heat dissipation sheet 401 may be integrally formed and may include a first diffusion portion 451, a second diffusion portion 452, and a third diffusion portion 453 extending in substantially the same thickness. The anti-shock member 460 of the heat dissipation sheet 401 may include a first member 461 and a second member 462 spaced apart from each other.

According to an embodiment, the first portion 401a of the heat dissipation sheet 401 may be provided in a stacked structure of the first diffusion portion 451 and the first member 461. The first diffusion portion 451 may be disposed to face in the first direction (+Z axis direction). The first member 461 may be disposed to face in the second direction (−Z axis direction) opposite to the first direction (+Z axis direction). For example, the first diffusion portion 451 may be disposed toward the electrical element 430 and/or the display assembly 410. The first member 461 may be disposed toward the inside of the bracket 420. As another example, the first diffusion portion 451 may be disposed in contact with the electrical element 430. The first member 461 may be disposed in contact with the inner side of the bracket 420.

According to an embodiment, the second portion 401*b* of the heat dissipation sheet 401 may be provided in a stacked structure of the second diffusion portion 452 and the second member 462. As compared to the first portion 401*a*, in the second portion 401*b* of the heat dissipation sheet 401, the vertical arrangement of the heat diffusion member 450 and the anti-shock member 460 may be reversed. The second diffusion portion 452 may be disposed to face in the second direction (−Z axis direction). The second member 462 may be disposed to face in the first direction (+Z axis direction). For example, the second diffusion portion 452 may be disposed toward the inside of the bracket 420. The second member 462 may be disposed toward the display assembly 410.

According to an embodiment, the third portion 401*c* of the heat dissipation sheet 401 may be provided as the third diffusion portion 453. The third diffusion portion 453 may extend from the first diffusion portion 451 disposed in the first area S1 of the bracket 420 and connect to the second diffusion portion 452 disposed in the second area S2 of the bracket 420. As another example, the third diffusion portion 453 may extend from the first diffusion portion 451 forming the first portion 401*a* of the heat dissipation sheet 401 and connect to the second diffusion portion 452 forming the second portion 401*b* of the heat dissipation sheet 401. According to an embodiment, the third diffusion portion 453 may be disposed to face in a different direction from the heat diffusion member 450 forming the first portion 401*a* and/or the second portion 401*b*. For example, the third diffusion portion 453 may be provided in a plate shape and be disposed so that one surface thereof faces in a direction substantially perpendicular to the first direction (+Z axis direction) and/or the second direction (−Z axis direction). As another example, the third diffusion portion 453 may include a surface having a predetermined inclination (e.g., about 45 degrees) with respect to the first direction (+Z axis direction) and/or the second direction (−Z axis direction).

According to various embodiments, the size of the surface area of the first portion 401*a* of the heat dissipation sheet 401 may differ from the size of the surface area of the second portion 401*b*. For example, the first surface of the first diffusion portion 451 may be formed to face in the first direction (+Z axis direction), and the second surface of the second diffusion portion 452 may be formed to face in the second direction (−Z axis direction). The area of the first surface may be smaller than the area of the second surface. As another example, a first length L1, which is the vertical length of the first surface, may be formed to be smaller than a second length L2, which is the vertical length of the second surface. According to an embodiment, the thickness of the heat diffusion member 450 may be different for each portion. The first diffusion portion 451 may form a first thickness D1. The second diffusion portion 452 may form a second thickness D2. The third diffusion portion 453 may form a third thickness D3. For example, when the area or the first length L1 of the first diffusion portion 451 is relatively smaller than the area or the second length L2 of the second diffusion portion 452, the first thickness D1 may be larger than the second thickness D2, enhancing heat diffusion. As another example, the third diffusion portion 453 having an area (or length) that is relatively smaller than the area (or length) of the first diffusion portion 451 and the second diffusion portion 452 may form the third thickness D3 to be larger than the first thickness D1 and/or the second thickness D2. Accordingly, it is possible to efficiently transfer heat transfer between the first diffusion portion 451 and the second diffusion portion 452. As another example, the first diffusion portion 451 and/or the third diffusion portion 453 having an area (or length) that is relatively smaller than the area (or length) of the second diffusion portion 452 may form the first thickness D1 and/or the third thickness D3 larger than the second thickness D2, enhancing heat diffusion.

According to an embodiment, the heat diffusion member 450 may include a material having thermal conductivity. For example, the heat diffusion member 450 may include at least one of graphite, carbon nanotubes, natural regenerated materials, silicone, or silicon.

According to an embodiment, the first surface of the first diffusion portion 451 may be disposed adjacent to the display assembly 410. The second surface of the second diffusion portion 452 may be disposed adjacent to the bracket 420. For example, the first surface of the first diffusion portion 451 may be disposed in contact with the electrical element 430, and the second surface of the second diffusion portion 452 may be disposed to contact or face the bracket 420. The heat generated from the electrical element 430 may be transferred to the first surface of the first diffusion portion 451 and may diffuse through the third diffusion portion 453 to the second surface of the second diffusion portion 452. The placement structure of the heat diffusion member 450 may minimize the transfer of the heat generated from the electrical element 430 to the surface of the display assembly 410 while increasing the heat diffused to the inside, e.g., the bracket 420, of the electronic device 101, thereby reducing surface heat generation when the display operates.

According to an embodiment, a plurality of anti-shock members 460 of the heat dissipation sheet 401 may be configured. For example, there may be included a first member 461 forming at least a portion of the first portion 401*a* of the heat dissipation sheet 401 and a second member 462 forming at least a portion of the second portion 401*b* of the heat dissipation sheet 401 and spaced apart from the first member 461.

According to an embodiment, the first member 461 may be stacked with the first diffusion portion 451, and the second member 462 may be stacked with the second diffusion portion 452. For example, one surface facing in the first direction (+Z axis direction) of the first member 461 may be disposed in contact with the first diffusion portion 451, and one surface facing in the second direction (−Z axis direction) of the second member 462 may be disposed in contact with the second diffusion portion 452.

According to an embodiment, the first member 461 may be formed to have an area corresponding to the first diffusion portion 451, and the second member 462 may be formed to have an area corresponding to the second diffusion portion 452. For example, the third surface of the first member 461 may be formed to face in the second direction (−Z axis direction), and the fourth surface of the second member 462 may be formed to face in the first direction (+Z axis direction), and the area of the third surface may be formed to be smaller than the area of the fourth surface.

According to an embodiment, the third surface of the first member 461 may be disposed adjacent to the bracket 420, and the fourth surface of the second member 462 may be disposed adjacent to the display assembly 410. For example, as the first member 461 and the second member 462 are formed to surround at least a portion of the front portion (e.g., portion facing in the +Z axis direction) of the heat dissipation sheet 401 and the rear portion (e.g., portion facing in the −Z axis direction), it is possible to distribute the external impact applied to the ambient devices.

According to an embodiment, the anti-shock member 460 may include an elastic material. For example, the anti-shock member 460 may be a foam including a material, such as polyurethane (PU). The anti-shock member 460 may bright the stacked heat diffusion member 450 in tight contact to the display assembly 410 by compression and/or extension performance according to the elastic material. For example, the first portion 401*a* and/or second portion 401*b* of the heat dissipation sheet 401 includes the first diffusion portion 451 and/or second diffusion portion 452 exposed in the first direction (+Z axis direction) and is attached to a lower surface (e.g., surface facing in the −Z axis direction) of the display assembly 410. However, as an air gap is created in the attached portion, assemblability may be degraded. According to the disclosure, as the first member 461 and/or the second member 462 is disposed under the first diffusion portion 451 and/or the second diffusion portion 452, and a force to bring the first diffusion portion 451 and/or second diffusion portion 452 in tight in the first direction (+Z axis direction) is provided, it is possible to remove the air gap between the display assembly 410 and the first diffusion portion 451 and/or second diffusion portion 452 while enhancing the adhesion of the assembly.

FIG. 6A is a see-through view related to a display and an internal component as viewed from the front of an electronic device (e.g., as viewed from the +Z axis direction of FIG. 5) according to an embodiment of various embodiments of the disclosure. FIG. 6B is a see-through view related to a bracket and an internal component as viewed from the rear of the electronic device (e.g., as viewed from the −Z axis direction of FIG. 5). FIG. 7 is a cross-sectional view taken along A-A' of the electronic device structure of FIGS. 6A and 6B.

According to various embodiments, an electronic device (e.g., the electronic device 101 of FIGS. 1 to 4) may include a display assembly 410, at least one electrical element 430, a heat dissipation sheet 402, and a bracket 420. According to an embodiment, the configuration of the display assembly 410, at least one electrical element 430, heat dissipation sheet 401, and bracket 420 of FIGS. 6A to 7 may be identical in whole or part to the configuration of the display assembly 410, at least one electrical element 430, heat dissipation sheet 401, and bracket 420 of FIG. 5.

According to various embodiments, as seen through the front surface of the display assembly 410, a first electrical element 431 electrically connected with the display (e.g., the display 330 of FIG. 4) may be disposed in a lower area. A second electrical element 432 and the camera module 433 (e.g., the camera module 180 of FIG. 1) disposed on the internal printed circuit board (e.g., the printed circuit board 340 of FIG. 5) may be disposed in the upper area. Hereinafter, a structure of the first electrical element 431 and the heat dissipation sheet 402 disposed in the lower area are described.

Referring to FIGS. 6A to 7, the first electrical element 431 for driving the display may be disposed on one side of the display assembly 410. For example, the first electrical element 431 may be a display driver IC (DDI). The heat generated from the first electrical element 431 may be diffused to the bracket 420 through the heat dissipation sheet 402.

According to various embodiments, the heat dissipation sheet 402 may be divided into a plurality of areas, and the placement relationship of the heat diffusion member 450 and the anti-shock member 460 may be configured to differ per area. The heat dissipation sheet 402 may include a first portion 402*a* disposed to face the first electrical element 431, a second portion 402*b* disposed to face the bracket 420, and a third portion 402*c* connecting the first portion 402*a* and the second portion 402*b*.

According to an embodiment, the first portion 402*a* and the second portion 402*b* of the heat dissipation sheet 402 may be provided in a stacked structure of the heat diffusion member 450 and the anti-shock member 460. In the first portion 402*a*, the heat diffusion member 450 may be disposed to face the first electrical element 431 and/or the display assembly 410, and the anti-shock member 460 may be disposed to face the inside of the bracket 420. In the second portion 402*b*, the heat diffusion member 450 may be disposed to face the inside of the bracket 420, and the anti-shock member 460 may be disposed to face the display assembly 410. The third portion 402*c* of the heat dissipation sheet 402 may have the heat diffusion member 450 disposed, be formed to pass through the heat dissipation sheet 402, and provide a path for exchanging the heat transferred to the heat diffusion member 450 of the first portion 402*a* and the heat diffusion member 450 of the second portion 402*b*.

According to an embodiment, the heat generated from the first electrical element 431 may be transferred to the heat diffusion member 450 of the first portion 402*a* and be transferred to the heat diffusion member 450 of the second portion 402*b* through the third portion 402*c*. The heat diffused to the heat diffusion member 450 of the second portion 402*b* may be diffused to the bracket 420. The placement structure of the heat diffusion member 450 may reduce the transfer of the heat generated from the first electrical element 431 to the surface of the display assembly 410 while increasing the heat diffusion to the inside, e.g., the bracket 420, of the electronic device, thereby reducing localized surface heat generation when the display operates.

Figures 8A, 8B:
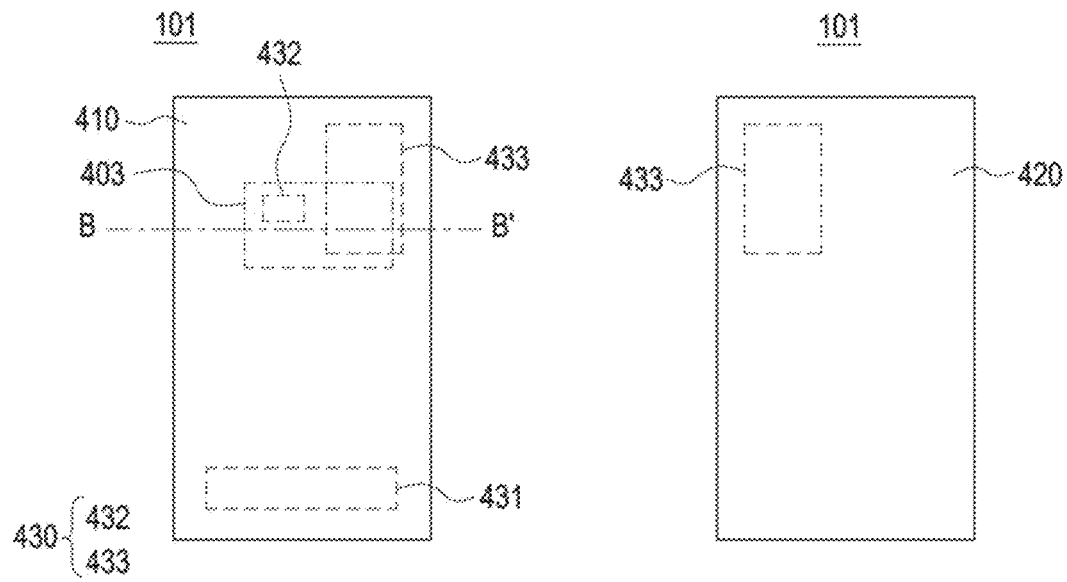
FIG. 8A is a see-through view illustrating a display and an internal component as viewed from the front of an electronic device according to an embodiment of various embodiments of the disclosure.
FIG. 8B is a see-through view related to a bracket and an internal component as viewed from the rear of an electronic device.
Figure 9:
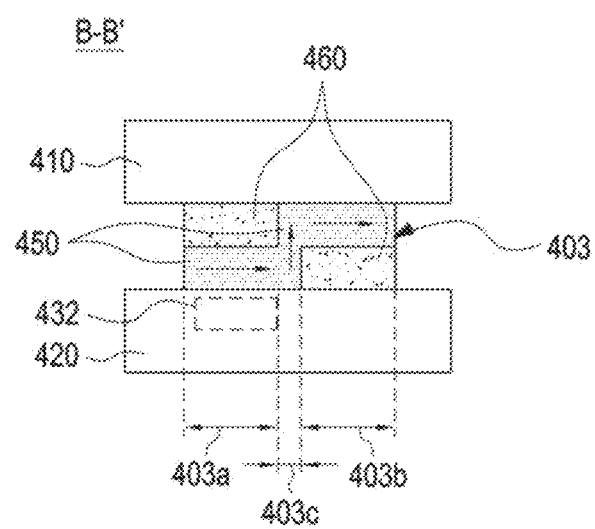
FIG. 9 is a cross-sectional view taken along B-B' of the electronic device structure of FIGS. 8A and 8B.

FIG. 8A is a see-through view related to a display and an internal component as viewed from the front of an electronic device (e.g., as viewed from the +Z axis direction of FIG. 5) according to an embodiment of various embodiments of the disclosure. FIG. 8B is a see-through view related to a bracket and an internal component as viewed from the rear of the electronic device (e.g., as viewed from the −Z axis direction of FIG. 5). FIG. 9 is a cross-sectional view taken along B-B' of the electronic device structure of FIGS. 8A and 8B.

According to various embodiments, an electronic device (e.g., the electronic device 101 of FIGS. 1 to 4) may include a display assembly 410, at least one electrical element 430, a heat dissipation sheet 403, and a bracket 420. According to an embodiment, the configuration of the display assembly 410, at least one electrical element 430, heat dissipation sheet 403, and bracket 420 of FIGS. 8A to 9 may be identical in whole or part to the configuration of the display assembly 410, at least one electrical element 430, heat dissipation sheet 401, and bracket 420 of FIG. 5.

According to various embodiments, as seen through the front surface of the display assembly 410, a second electrical element 432 and the camera module 433 (e.g., the camera module 180 of FIG. 1) disposed on the internal printed circuit board (e.g., the printed circuit board 340 of FIG. 5) may be disposed in the upper area. Hereinafter, a structure of the second electrical element 432 disposed in the upper area, the camera module 433, and the heat dissipation sheet 403 disposed adjacent to the second electrical element 432 is described.

Referring to FIGS. 8A and 9, the second electrical element 432 may be disposed adjacent to the camera module

433. For example, the second electrical element 432 may be an application processor (AP). The heat generated from the second electrical element 432 may be diffused to the display assembly 410 through the heat dissipation sheet 403.

According to various embodiments, the heat dissipation sheet 403 may be divided into a plurality of areas, and the placement relationship of the heat diffusion member 450 and the anti-shock member 460 may be configured to differ per area. The heat dissipation sheet 403 may include a first portion 403*a* disposed to face the second electrical element 432, a second portion 403*b* disposed adjacent to the display assembly 410, and a third portion 403*c* connecting the first portion 403*a* and the second portion 403*b*.

According to an embodiment, the first portion 403*a* and the second portion 403*b* of the heat dissipation sheet 403 may be provided in a stacked structure of the heat diffusion member 450 and the anti-shock member 460. In the first portion 403*a*, the heat diffusion member 450 may be disposed to face the second electrical element 432 and/or the bracket 420, and the anti-shock member 460 may be disposed to face the display assembly 410. In the second portion 403*b*, the heat diffusion member 450 may be disposed to face the display assembly 410, and the anti-shock member 460 may be disposed to face the inside of the bracket 420. The third portion 403*c* of the heat dissipation sheet 403 may have the heat diffusion member 450 disposed and provide a path for exchanging the heat transferred to the heat diffusion member 450 of the first portion 403*a* and the heat diffusion member 450 of the second portion 403*b*.

According to an embodiment, the heat generated from the second electrical element 432 may be transferred to the heat diffusion member 450 of the first portion 403*a* and be transferred to the heat diffusion member 450 of the second portion 403*b* through the third portion 403*c*. The heat diffused to the heat diffusion member 450 of the second portion 403*b* may be diffused to the outside through the surface of the display assembly 410. Due to the placement structure of the heat diffusion member 450, it is possible to diffuse the heat generated from the second electrical element 432 positioned adjacent to the camera module 433 to the surface of the display assembly 410 through the inside of the electronic device while minimizing influence of the camera module 433. The heat diffused to the surface of the display assembly 410 may be a designated distance spaced apart from the first electrical element (e.g., the first electrical element 431 of FIGS. 6A, 6B, and 7) so that the heat generated from the first electrical element 431 has no influence while effectively diffusing the heat generated from the second electrical element 432.

FIG. 10A is a see-through view related to a display and an internal component as viewed from the front of an electronic device (e.g., as viewed from the +Z axis direction of FIG. 5) according to an embodiment of various embodiments of the disclosure. FIG. 10B is a see-through view related to a bracket and an internal component as viewed from the rear of the electronic device (e.g., as viewed from the −Z axis direction of FIG. 5). FIG. 11 is a cross-sectional view taken along C-C' of the electronic device structure of FIGS. 10A and 10B.

According to various embodiments, an electronic device (e.g., the electronic device 101 of FIGS. 1 to 4) may include a display assembly 410, at least one electrical element 430, a heat dissipation sheet 404, and a bracket 420. According to an embodiment, the configuration of the display assembly 410, at least one electrical element 430, heat dissipation sheet 404, and bracket 420 of FIGS. 10A to 11 may be identical in whole or part to the configuration of the display assembly 410, at least one electrical element 430, heat dissipation sheet 401, and bracket 420 of FIG. 5.

According to various embodiments, as seen through the front surface of the display (e.g., the display 330 of FIG. 4), a second electrical element 432 and the camera module 433 (e.g., the camera module 180 of FIG. 1) disposed on the internal printed circuit board (e.g., the printed circuit board 340 of FIG. 5) may be disposed in the upper area. Hereinafter, a structure of the second electrical element 432 disposed in the upper area and the heat dissipation sheet 404 disposed adjacent to the second electrical element 432 is described. The heat dissipation sheet 404 may be disposed to overlap most of the area of the display assembly 410.

Referring to FIGS. 10A to 11, a second electrical element 432 for driving and/or controlling the electronic device may be disposed in the electronic device. For example, the second electrical element 432 may be an AP. The heat generated from the second electrical element 432 may be diffused to the display assembly 410 through the heat dissipation sheet 404.

According to various embodiments, the heat dissipation sheet 404 may be divided into a plurality of areas, and the placement relationship of the heat diffusion member 450 and the anti-shock member 460 may be configured to differ per area. The heat dissipation sheet 404 may include a first portion 404*a* disposed to face the second electrical element 432, a second portion 404*b* disposed adjacent to the display assembly 410, and a third portion 404*c* connecting the first portion 404*a* and the second portion 404*b*.

According to an embodiment, the first portion 404*a* and the second portion 404*b* of the heat dissipation sheet 404 may be provided in a stacked structure of the heat diffusion member 450 and the anti-shock member 460. In the first portion 404*a*, the heat diffusion member 450 may be disposed to face the second electrical element 432 and/or the bracket 420, and the anti-shock member 460 may be disposed to face the display assembly 410. In the second portion 404*b*, the heat diffusion member 450 may be disposed to face the display assembly 410, and the anti-shock member 460 may be disposed to face the inside of the bracket 420. The third portion 404*c* of the heat dissipation sheet 404 may have the heat diffusion member 450 disposed and provide a path for exchanging the heat transferred to the heat diffusion member 450 of the first portion 404*a* and the heat diffusion member 450 of the second portion 404*b*.

According to an embodiment, the heat generated from the second electrical element 432 may be transferred to the heat diffusion member 450 of the first portion 404*a* and be transferred to the heat diffusion member 450 of the second portion 404*b* through the third portion 404*c*. The heat diffused to the heat diffusion member 450 of the second portion 404*b* may be diffused to the outside through the surface of the display assembly 410. Due to the placement structure of the heat diffusion member 450, the heat generated from the second electrical element 432 may not be maintained for a long time in the electronic device but may be rapidly diffused to the surface of the display assembly 410. The heat diffused to the surface of the display assembly 410 may be radiated to the outside of the electronic device.

Figure 12A:
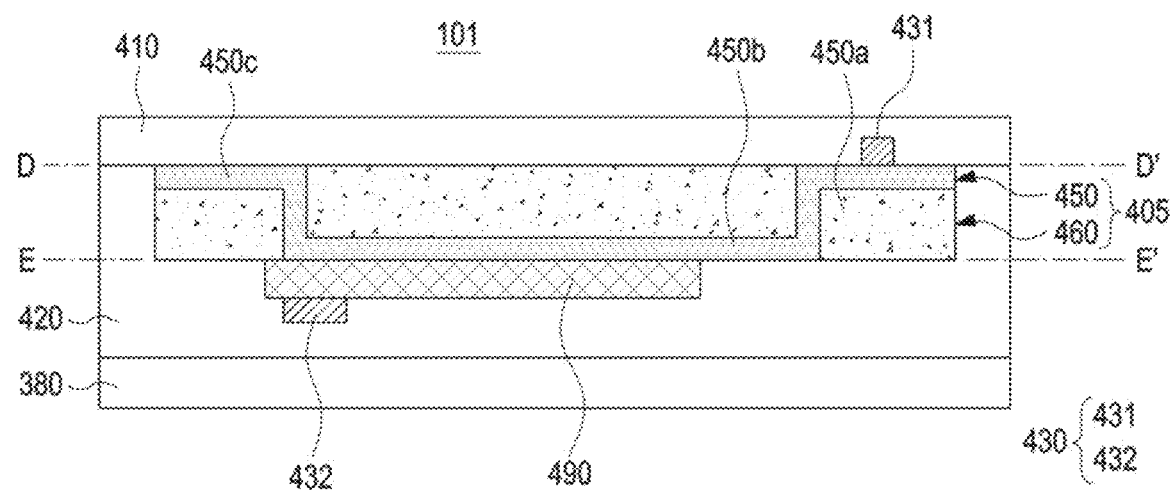
FIG. 12A is a cross-sectional view of an electronic device vertically cut to show a structure for heat dissipation around an electronic component according to one of various embodiments of the disclosure.
Figure 12B:
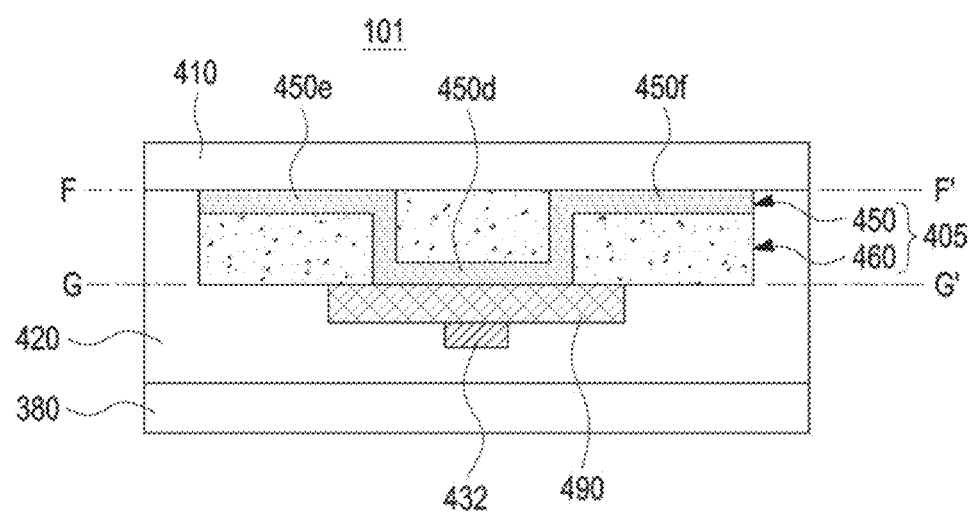
FIG. 12B is a cross-sectional view of an electronic device horizontally cut to show a structure for heat dissipation around an electronic component according to an embodiment of the disclosure.

FIG. 12A is a cross-sectional view of an electronic device vertically (e.g., A-A' direction of FIG. 6A or C-C' direction of FIG. 10A) cut to show a structure for heat dissipation around an electronic component according to one of various embodiments of the disclosure. FIG. 12B is a cross-sectional view of an electronic device horizontally (e.g., B-B' direction of FIG. 8A) cut to show a structure for heat dissipation around an electronic component according to an embodiment of the disclosure.

Figure 13A:
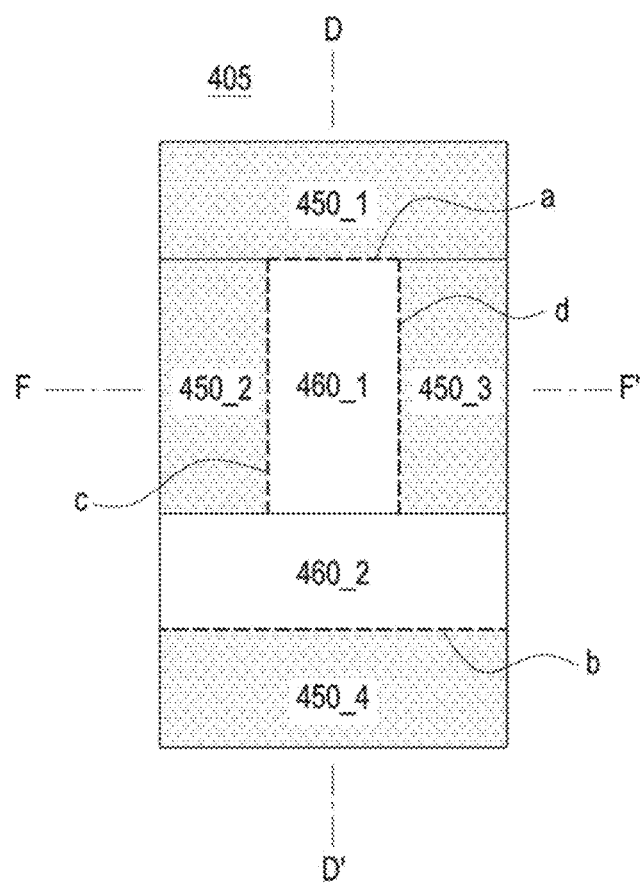
FIG. 13A is a front view illustrating a heat dissipation sheet mounted in an electronic device according to various embodiments of the disclosure.
Figure 13B:
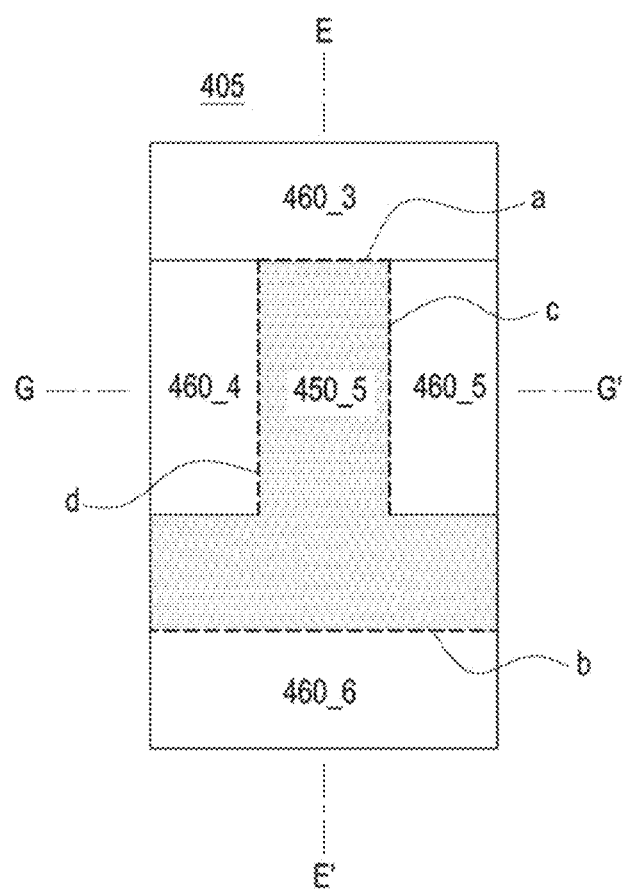
FIG. 13B is a rear view illustrating a heat dissipation sheet mounted in an electronic device according to various embodiments of the disclosure.

FIG. 13A is a front view illustrating a heat dissipation sheet mounted in an electronic device according to various embodiments of the disclosure. FIG. 13B is a rear view illustrating a heat dissipation sheet mounted in an electronic device according to various embodiments of the disclosure. For example, FIG. 13A is a cross-sectional view taken along D-D' direction of FIG. 12A and F-F' direction of FIG. 12B. FIG. 13B is a cross-sectional view taken along E-E' direction of FIG. 12A and G-G' direction of FIG. 12B.

According to various embodiments, an electronic device (e.g., the electronic device 101 of FIGS. 1 to 4) may include a display assembly 410, an electrical element 430, a heat dissipation sheet 405, a bracket 420, and a rear plate 380. According to an embodiment, the configuration of the display assembly 410, the electrical element 430, the heat dissipation sheet 405, the bracket 420 and the rear plate 380 of FIGS. 12A to 13B may be identical in whole or part to the configuration of the display assembly 410, the electrical element 430, the heat dissipation sheet 401, the bracket 420, and the rear plate 380 of FIG. 5.

According to various embodiments, the heat dissipation sheet 405 may be stacked in a plurality of layers. The heat dissipation sheet 405 may include a heat diffusion member 450 for diffusing the heat generated from the electrical element 430 and an anti-shock member 460 disposed to be stacked with at least a portion of the heat diffusion member 450 to protect internal components of the electronic device 101 from external impact.

According to various embodiments, the heat dissipation sheet 405 may be disposed so that the stacked relationship between the heat diffusion member 450 and the anti-shock member 460 differs per area. For example, the heat diffusion member 450 and the anti-shock member 460 may be disposed sequentially with respect to the display assembly 410 in a partial area of the heat dissipation sheet 405. In another area of the heat dissipation sheet 405, the anti-shock member 460 and the heat diffusion member 450 may be sequentially disposed with respect to the display assembly 410.

Referring to FIG. 13A, when viewed from above the heat dissipation sheet 405, at least a portion of the anti-shock member 460 may be positioned between heat diffusion members 450. Referring to FIG. 13B, when viewed from under the heat dissipation sheet 401, at least a portion of the heat diffusion member 450 may be positioned between anti-shock members 460. According to an embodiment, when viewed from above the heat dissipation sheet 405, the heat diffusion member 450 may include a first portion 450_1, a second portion 450_2, a third portion 450_3, and a fourth portion 450_4 spaced apart from the first portion 450_1. When viewed from under the heat dissipation sheet 405, the heat diffusion member 450 may include a fifth portion 450_5. The solid-line portion of the heat diffusion member 450 may represent a cut surface, and the dot-line portions may be portions connected to each other with a step or extended as a flat surface. For example, the first portion 450_1 and the fifth portion 450_5 may be connected, with a step, by the upper dot-line portion a. As another example, the fourth portion 450_4 and the fifth portion 450_5 may be connected, with a step, by the lower dot-line portion b. As another example, the second portion 450_2 and the third portion 450_3 may be connected, with a step, by the left dot-line portion c and the right dot-line portion d. According to another embodiment, when viewed from above the heat dissipation sheet 450, the anti-shock member 460 may include a sixth portion 460_1 and a seventh portion 460_2. The sixth portion 460_1 and the seventh portion 460_2 may be integrally formed or formed separately. The anti-shock member 460 may include an eighth portion 460_3 disposed to face the first portion 450_1 and a ninth portion 460_4 and a tenth portion 460_5 disposed to face the third portion 450_3 and the second portion 450_2. The anti-shock member 460 may include an eleventh portion 460_6 spaced apart from the eighth portion 460_3, the ninth portion 460_4, and the tenth portion 460_5. The eighth portion 460_3, the ninth portion 460_4, and the tenth portion 460_5 may be integrally formed or formed separately. Referring to FIGS. 12A and 12B, the electronic device 101 may include a display assembly 410 and a heat dissipation sheet 405 under the display assembly 410, a first electrical element 431, a second electrical element 432, a bracket 420, and a rear plate 380. As another example, in the electronic device 101, a heat conduction sheet 490 may be disposed adjacent to the second electrical element 432.

According to an embodiment, the heat dissipation sheet 405 may be divided into a plurality of areas depending on the placement relationship of the heat diffusion member 450. As compared with FIG. 5, the heat dissipation sheet 405 of FIGS. 12A and 12B may be configured with more stepped shapes while having the heat conduction sheet 490 disposed adjacent to the second electrical element 432 to enhance heat diffusion.

Referring to FIG. 12A, the heat diffusion member 450 of the heat dissipation sheet 405 may have a plurality of stepped shapes. The first diffusion portion 450a may be disposed to face the first electrical element 431, and the second diffusion portion 450b may be disposed to face the second electrical element 432 and/or the heat conduction sheet 490. The third diffusion portion 450c may be spaced apart from the first diffusion portion 450a and may be disposed adjacent to the display assembly 410. The first diffusion portion 450a of the heat diffusion member 450 may receive the heat generated from the first electrical element 431 and diffuse it to the bracket 420. The second diffusion portion 450b of the heat diffusion member 450 may receive the heat generated from the second electrical element 432 and diffuse it to the surface of the display assembly 410. For example, the heat conduction sheet 490 may be disposed between the second diffusion portion 450b of the heat diffusion member 450 and the second electrical element 432 to first diffuse the heat generated from the second electrical element 432 and may then transfer the heat to the heat diffusion member 450 (e.g., the second diffusion portion 450b, the third diffusion portion 450c, the fourth diffusion portion 450d, the fifth diffusion portion 450e, or the sixth diffusion portion 450f) and/or other portions (e.g., the bracket 420). The anti-shock members 460 of the heat dissipation sheet 405 may be disposed to remove the plurality of stepped shapes and be spaced apart from each other due to a portion of the heat diffusion member 450 disposed therebetween.

Referring to FIG. 12B, the heat diffusion member 450 of the heat dissipation sheet 405 includes a plurality of stepped shapes. The fourth diffusion portion 450d may be disposed to face the second electrical element 432 and/or the heat conduction sheet 490, and the fifth diffusion portion 450e and sixth diffusion portion 450f stepped from two opposite sides of the fourth diffusion portion 450d may be disposed to face the display assembly 410. The fourth diffusion portion 450d of the heat diffusion member 450 may receive the heat generated from the second electrical element 432 and diffuse it to the surface of the display assembly 410. For example, the heat conduction sheet 490 may be disposed between the fourth diffusion portion 450d of the heat diffusion member 450 and the second electrical element 432 to first diffuse the heat generated from the second electrical element 432 and may then transfer the heat to the heat diffusion member 450 (e.g., the second diffusion portion 450b, the third diffusion portion 450c, the fourth diffusion portion 450d, the fifth diffusion portion 450e, or the sixth diffusion portion 450f) and/or other portions (e.g., the bracket 420).

Figure 14A:
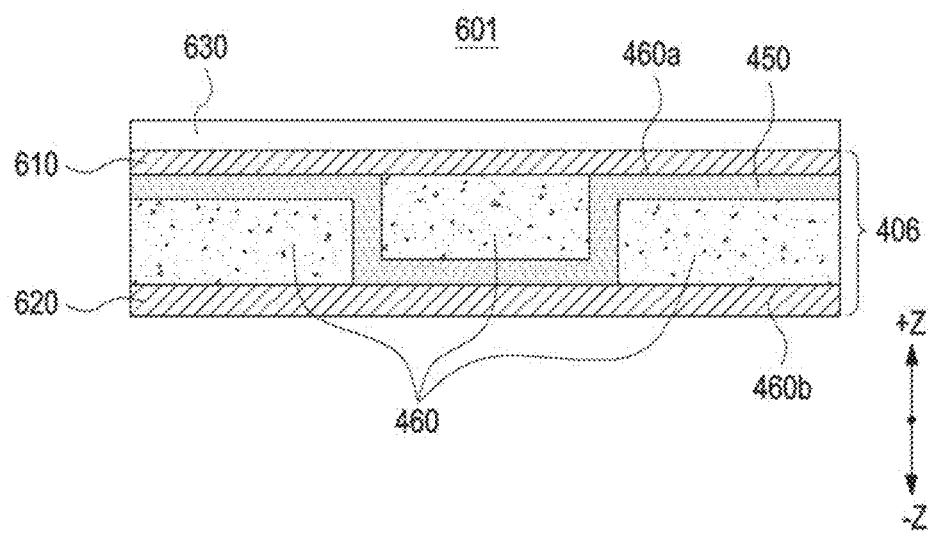
FIG. 14A is a cross-sectional view illustrating a stacked state of a joined structure including a heat dissipation sheet according to an embodiment of the disclosure.
Figure 14B:
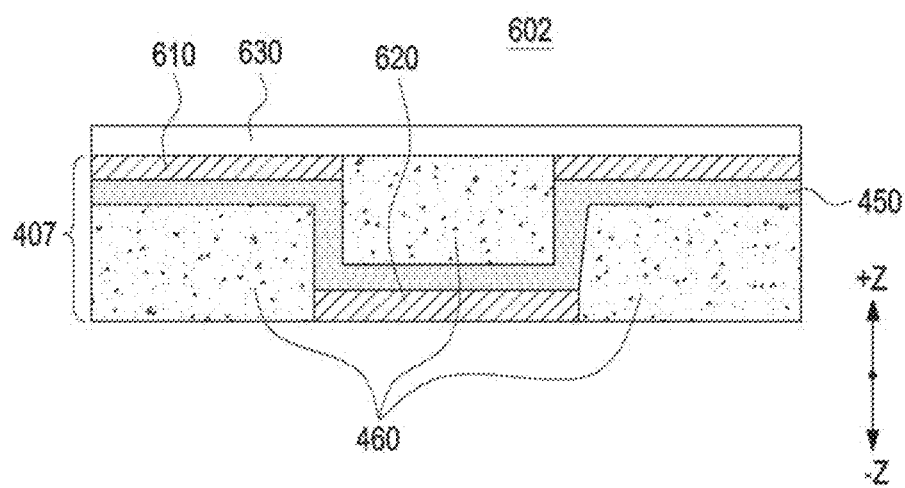
FIG. 14B is a cross-sectional view illustrating a stacked state of a joined structure including a heat dissipation sheet according to another embodiment of the disclosure.

FIG. 14A is a cross-sectional view illustrating a stacked state of a joined structure including a heat dissipation sheet according to an embodiment of the disclosure. FIG. 14B is a cross-sectional view illustrating a stacked state of a joined structure including a heat dissipation sheet according to another embodiment of the disclosure.

According to various embodiments, the heat dissipation sheet 406 and 407 may be stacked in a plurality of layers. The heat dissipation sheet 406 and 407 may include a heat diffusion member 450 for diffusing the heat generated from the electrical element (e.g., the electrical element 430 of FIG. 5) and an anti-shock member 460 disposed to be stacked with at least a portion of the heat diffusion member 450 to protect internal components of the electronic device from external impact. The configuration of the heat dissipation sheet 406 and 407 of FIGS. 14A and 14B may be identical in whole or part to the configuration of the heat dissipation sheet 401 of FIG. 5.

As compared with the heat dissipation sheet 401 of FIG. 5, the joined structure 601 and 602 of the heat dissipation sheet 406 and 407 of FIGS. 14A and 14B may include a heat diffusion member 450, an anti-shock member 460, adhesive members 610 and 620 (ADH, adhesive), and a release sheet 630 (e.g., PET sheet). For example, the heat diffusion member 450 may be formed in a plate shape. Referring to FIG. 14A, the stacked structure of a portion of the heat dissipation sheet 406 constituted of the heat diffusion member 450, the anti-shock member 460, and the adhesive member 610 and 620 may include a first surface 460a facing in the first direction (+Z axis direction) and forming a uniform surface and a second surface 460b facing in the second direction (−Z axis direction) and forming a uniform surface. The first adhesive member 610 and the release sheet 630 may be stacked on the first surface 460a. The second adhesive member 620 may be disposed on the second surface 460b. The release sheet 630 may be removed in the process of being coupled to the display assembly (e.g., the display assembly 410 of FIG. 5) and/or the bracket (e.g., the bracket 420 of FIG. 5). Referring to FIG. 14B, the anti-shock member 460 may be provided as a member containing an adhesive component material. According to various embodiments, in the stacked structure of the heat dissipation sheet 407 constituted of the heat diffusion member 450, the anti-shock member 460, and the adhesive members 610 and 620, the anti-shock member 460 may protrude beyond the heat diffusion member 450 in the first direction (+Z axis direction) and/or the second direction (−Z axis direction). For example, at least a portion of the anti-shock member 460 and the adhesive members 610 and 620 may form at least a portion of the front portion (e.g., portion facing in the +Z axis direction) and the rear portion (e.g., portion facing in the −Z axis direction) of the heat dissipation sheet 407.

Figure 15:
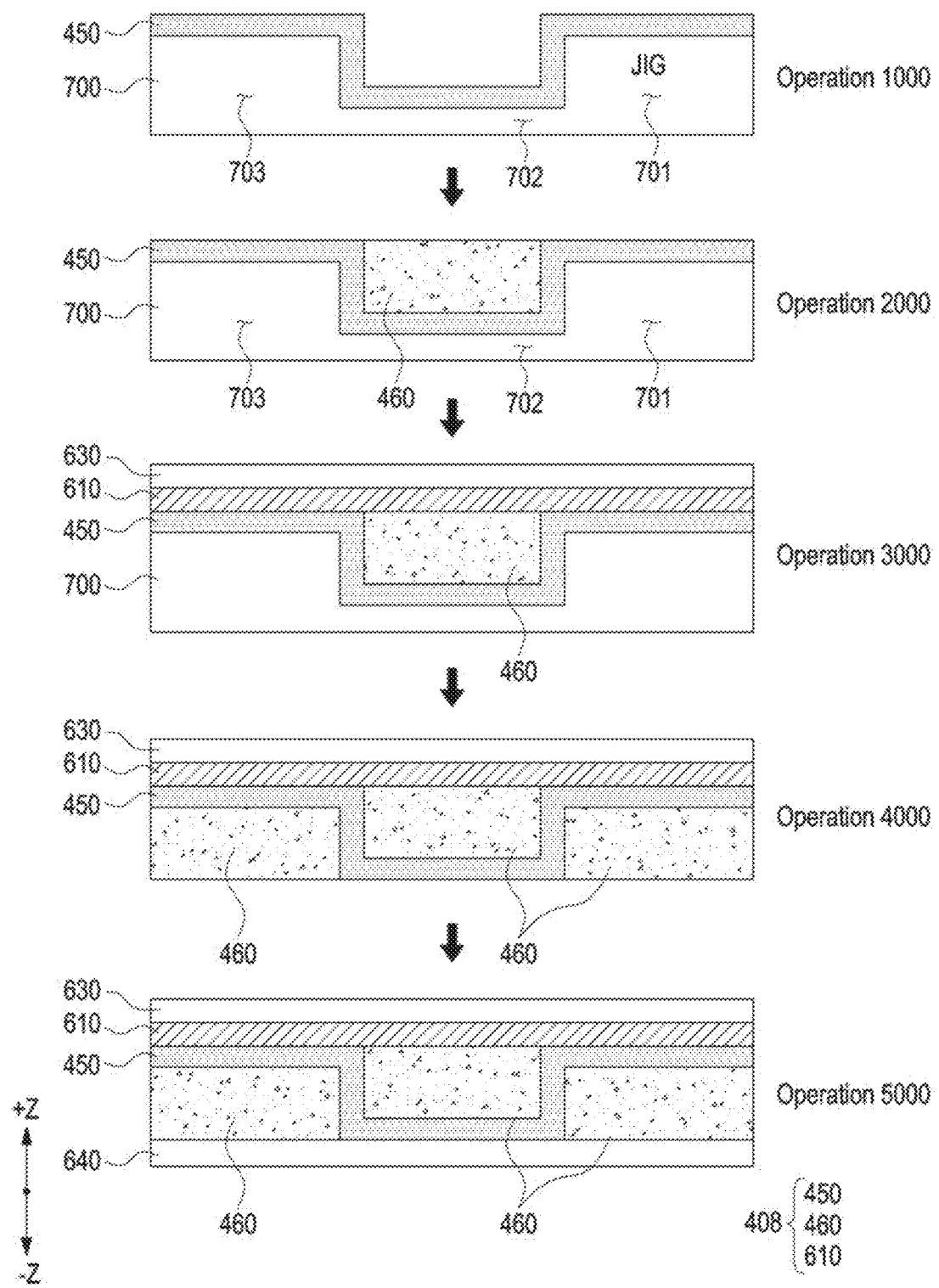
FIG. 15 is a flowchart illustrating a method for manufacturing a joined structure including a heat dissipation sheet according to an embodiment of the disclosure.

FIG. 15 is a flowchart illustrating a method for manufacturing a joined structure including a heat dissipation sheet according to an embodiment of the disclosure.

According to various embodiments, the heat dissipation sheet 408 may be stacked in a plurality of layers. The heat dissipation sheet may include a heat diffusion member 450 for diffusing the heat generated from the electrical element (e.g., the electrical element 430 of FIG. 5) and an anti-shock member 460 disposed to be stacked with at least a portion of the heat diffusion member 450 to protect internal components of the electronic device from external impact. As another example, the heat dissipation sheet 408 may further include an adhesive member 610 disposed on one surface of the heat diffusion member 450 and/or the anti-shock member 460.

The configuration of the heat dissipation sheet of FIG. 15 may be identical in whole or part to the configuration of the heat dissipation sheet 401 of FIG. 5.

According to various embodiments, the joined structure including the heat dissipation sheet may be manufactured to be easily attached in the electronic device and, as the heat source and surrounding devices are assembled in tight contact, reduce thermal resistance. The joined structure may be manufactured by disposing the adhesive member 610 or release sheets 630 and 640 on the front surface and rear surface of the heat dissipation sheet.

By operation 1000, a jig 700 having a designated shape may be provided, and the heat diffusion member 450 may be disposed on the jig 700. The jig 700 may have a shape corresponding to the designated shape of the heat dissipation sheet to be implemented by the manufacturer. For example, the jig 700 may include a recessed portion (e.g., stepped shape) in a specific area. As another example, the jig 700 may include a first portion 701 forming a first thickness, a second portion 702 forming a second thickness and extending from the first portion 701, and a third portion 703 forming a third thickness and extending from the second portion 702. The first thickness and the third thickness may be the same. The second thickness may be smaller than the first thickness and/or third thicknesses.

The heat diffusion member 450 is shaped as an adhesive sheet having a substantially constant thickness and, as the jig 700 is disposed, a predetermined portion may include a recessed portion (e.g., stepped shape) to correspond to the designated shape of the jig 700. According to an embodiment, by the recessed portion, a partial area of the heat diffusion member 450 may be disposed adjacent to the display assembly, and another portion may be disposed adjacent to the bracket. According to another embodiment, when the heat diffusion member 450 is substantially disposed in the electronic device, a partial area may be positioned adjacent to the heat-generating portion, e.g., electrical element while another portion is positioned to transfer the heat generated from the electrical element to another device, by the recessed portion.

By operation 2000, the anti-shock member 460 may be disposed on the jig 700. The anti-shock member 460 may be disposed in the recessed portion. For example, a portion of the heat diffusion member 450 and the anti-shock member 460 may be stacked on the recessed portion. According to an embodiment, as the anti-shock member 460 is disposed to remove the recessed shape, one surface of the heat dissipation sheet facing in the first direction (+Z axis direction) may overall form a substantially uniform or flat surface. For example, the heat diffusion member 450 of the heat dissipation sheet disposed on the first portion 701 and third portion 703 of the jig 700 may expose the surface facing in the first direction (+Z axis direction), and the anti-shock member 460 of the heat dissipation sheet disposed on the second portion 702 may expose the surface facing in the first direction (+Z axis direction).

By operation 3000, the adhesive member 610 and the release sheet 630 may sequentially be stacked on a substantially uniform surface facing in the first direction (+Z axis direction) of the heat dissipation sheet.

By operation 4000, the laminate including the heat dissipation sheet is separated from the jig 700, and the anti-shock member 460 may be disposed in an area of the rear surface (one surface facing in the second direction (−Z axis direction)) of the heat dissipation sheet contacting the jig 700. There may be provided a plurality of anti-shock members 460 which may be disposed in contact with the heat diffusion member 450 disposed on the first portion 701 and third portion 703 of the jig 700. The anti-shock member 460 may be disposed to compensate for the step of the recessed portion of the heat diffusion member 450 so that the other surface of the heat dissipation sheet 408 facing in the second direction (−Z axis direction) may overall form a substantially uniform or flat surface.

By operation 5000, the release sheet 640 may be disposed on one surface facing in the second direction (−Z axis direction) of the heat dissipation sheet 408. In general, the release sheet 640 may be configured in a flat shape difficult to deform and, as one surface facing in the second direction (−Z axis direction) of the heat dissipation sheet 408 is formed of a flat surface, the joined structure may be easy to manufacture.

Figure 16A:
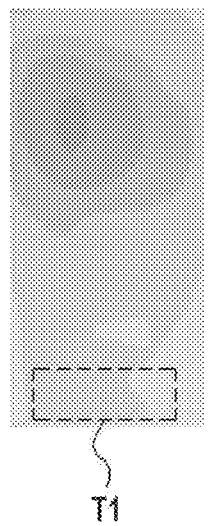
FIG. 16A is a view illustrating a difference in temperature per area of a front surface of an electronic device when a heat dissipation sheet is applied according to an embodiment of the disclosure.
Figure 16B:
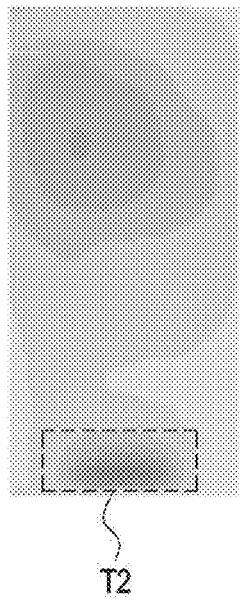
FIG. 16B is a view illustrating a difference in temperature per area of a front surface of a conventional electronic device.

FIG. 16A is a view illustrating a difference in temperature per area of a front surface of an electronic device when a heat dissipation sheet is applied according to an embodiment of the disclosure. FIG. 16B is a view illustrating a difference in temperature per area of a front surface of a conventional electronic device.

Referring to FIGS. 16A and 16B, it is possible to identify a change in the surface temperature of the display assembly according to heat generation of a display driver IC (DDI) for driving the display. It may be identified that in the electronic device including the heat dissipation sheet according to an embodiment of the disclosure, as compared with the conventional electronic device, the temperature is reduced in a partial area of the surface of the display assembly. Thus, it is possible to minimize the transfer to the surface of the display assembly of the heat generated from the DDI while increasing the heat diffusion to the inside, e.g., the bracket, of the electronic device, thereby reducing surface heat generation when the display operates.

Referring to FIG. 16A, it may be identified that the temperature according to the heat generated from the area T1 of the display assembly adjacent to the DDI is about 41.1 degrees. Referring to FIG. 16B, in the conventional electronic device, it may be identified that the temperature according to the heat generated from the area T2 of the display assembly adjacent to the DDI is about 45.8 degrees. Accordingly, when the heat dissipation sheet according to an embodiment of the disclosure is applied, a heat reduction corresponding to about 4.7-degree difference may be identified on the surface of the display assembly adjacent to the DDI.

According to various embodiments of the disclosure, the heat dissipation sheet 401, 402, 403, 404, 405, 406, 407, or 408 and the electronic device 101 including the same may adjust heat diffusion per stacked sheet and area while allowing for free design for the heat diffusion direction, as compared with the conventional heat dissipation sheet (e.g., graphite-wrapping form). According to various embodiments of the disclosure, it is possible to mitigate damage (e.g., cracks) to the heat diffusion member 450 by the anti-shock member 460 structure designed to surround a portion of the heat diffusion member 450. According to various embodiments of the disclosure, it is possible to reduce thermal resistance in the thickness direction of the heat dissipation sheet while allowing for physical connection of the heat source (e.g., the electrical element 450 of FIG. 5) and the heat conduction sheet (e.g., the heat conduction sheet 490 of FIGS. 12A and 12B) by the stepped structure of the heat diffusion member 450. According to various embodiments of the disclosure, an electronic device (e.g., the electronic device 101 of FIGS. 1 to 4) may comprise a first electrical element (e.g., the electrical element 430 of FIG. 5), a heat dissipation sheet (e.g., the heat dissipation sheet 401 of FIG. 5) including a heat diffusion member (e.g., the heat diffusion member 450 of FIG. 5) for diffusing heat generated from the first electrical element and an anti-shock member (e.g., the anti-shock member 460 of FIG. 5) disposed to be stacked with at least a portion of the heat diffusion member, and a bracket (e.g., the bracket 420 of FIG. 5) providing a space for receiving the heat dissipation sheet and including a first area (e.g., the first area S1 of FIG. 5) facing the first electrical element, a second area (e.g., the second area S2 of FIG. 5) spaced apart from the first area, and a third area (e.g., the third area S3 of FIG. 5) disposed between the first area and the second area. In the first area, a portion of the heat diffusion member may be disposed to face in a first direction (e.g., the first direction (+Z axis direction) of FIG. 5) toward the first electrical element, and a portion of the anti-shock member may be disposed to face in a second direction (e.g., the second direction (−Z axis direction) of FIG. 5) opposite to the first direction. In the second area, another portion of the heat diffusion member may be disposed to face in the second direction, and another portion of the anti-shock member may be disposed to face in the first direction. Another portion of the heat diffusion member disposed in the third area may extend from the heat diffusion member in the first area and connect to the heat diffusion member in the second area.

According to various embodiments, the heat diffusion member may include a first diffusion portion (e.g., the first diffusion portion 451 of FIG. 5) forming a first size and a second diffusion portion (e.g., the second diffusion portion 452 of FIG. 5) forming a second size larger than the first size. The first diffusion portion may be disposed more adjacent to the first electrical element than the second diffusion portion.

According to various embodiments, the electronic device may further comprise a display assembly (e.g., the display assembly 410 of FIG. 5) having at least a portion exposed to an outside in the first direction. The first electrical element may include a display driver IC (DDI) configured to drive the display assembly.

According to various embodiments, the heat dissipation sheet may be disposed between the display assembly and the bracket. A first diffusion portion (e.g., the first diffusion portion 451 of FIG. 5) of the heat diffusion member disposed in the first area of the bracket may be disposed in contact with the first electrical element.

According to various embodiments, a second diffusion portion (e.g., the second diffusion portion 452 of FIG. 5) of the heat diffusion member disposed in the second area of the bracket may be disposed adjacent to or in contact with the bracket.

According to various embodiments, one surface of a third diffusion portion (e.g., the third diffusion portion 453 of FIG. 5) of the heat diffusion member disposed in the third area of the bracket may have a designated slope or be perpendicular to one surface in the first direction in which the first diffusion portion faces.

According to various embodiments, the heat diffusion member may have at least a portion forming a stepped shape and include at least one material among graphite, carbon nanotubes, a natural renewable material, silicone, or silicon.

According to various embodiments, the heat dissipation sheet may include a first surface facing in the first direction and providing a flat surface and a second surface facing in the second direction and providing a flat surface. The first surface may be formed as the heat diffusion member disposed in the first area and the third area and the anti-shock member disposed in the second area are arranged side by side. The second surface may be formed as the heat diffusion member disposed in the second area and the third area and the anti-shock member disposed in the first area are arranged side by side.

According to various embodiments, the electronic device may further comprise an sheet disposed on the first surface or the second surface, wherein the sheet includes at least one of an adhesive member or a release sheet.

According to various embodiments, a first member (e.g., the first member 461 of FIG. 5) of the anti-shock member, disposed in the first area of the bracket, may be formed in a size corresponding to a size of the first diffusion portion. A second member (e.g., the second member 462 of FIG. 5) of the anti-shock member, disposed in the second area of the bracket, may be formed in a size corresponding to a size of the second diffusion portion. The first member and the second member may be spaced apart from each other.

According to various embodiments, the anti-shock member may include a first member and a second member. The first member and the second member may be disposed on two opposite sides of the third diffusion member to be spaced apart from each other.

According to various embodiments, the anti-shock member may be larger in thickness than the heat diffusion member. The anti-shock member may be a foam including a material, such as polyurethane (PU).

According to various embodiments, a transfer path may be formed along which the heat generated from the first electrical element may be transferred to the first diffusion portion, be diffused to the second diffusion portion through the third diffusion portion, and be then provided to the bracket.

According to various embodiments, the electronic device may further comprise a printed circuit board (e.g., the printed circuit board 340 of FIG. 5) disposed under the bracket and a second electrical element (e.g., the second electrical element 432 of FIGS. 12A and 12B) mounted on the printed circuit board. The second electrical element may be disposed adjacent to the heat diffusion member disposed in the second area.

According to various embodiments, the second electrical element may include at least one of a power management integrated circuit (PMIC), a power amplifier (PAM), an application processor (AP), a communication processor (CP), or a charger integrated circuit (IC).

According to various embodiments, the electronic device may further comprise at least one heat conduction sheet disposed between the second electrical element and the bracket. The heat conduction sheet may include at least one of a heat pipe, a copper plate, and a vapor chamber.

According to various embodiments of the disclosure, an electronic device may comprise a display (e.g., the display 330 of FIG. 4) having at least a portion exposed to face a front surface, a printed circuit board (e.g., the printed circuit board 340 of FIG. 5) disposed to face the display, at least one electrical element (e.g., the electrical element 430 of FIG. 5) electrically connected with the printed circuit board, a heat dissipation sheet (e.g., the heat dissipation sheet 401 of FIG. 5) having at least a portion disposed adjacent to the electrical element and including a heat diffusion member (e.g., the heat diffusion member 450 of FIG. 5) and an anti-shock member (e.g., the anti-shock member 460 of FIG. 5) disposed to be stacked with the heat diffusion member, and a bracket (e.g., the bracket 420 of FIG. 5) for providing a space to seat at least a portion of the heat dissipation sheet. The heat diffusion member may include a first portion (e.g., the first diffusion portion 451 of FIG. 5) forming a first area and a second portion (e.g., the second diffusion portion 452 of FIG. 5) forming a second area larger than the first area. The first portion may be disposed adjacent to the display, and the second portion may be disposed adjacent to the bracket.

According to various embodiments, the anti-shock member may include a third portion (e.g., the first member 461 of FIG. 5) corresponding to the first portion of the heat diffusion member and a fourth portion (e.g., the second member 462 of FIG. 5) corresponding to the second portion. The third portion and the fourth portion may be spaced apart from each other.

According to various embodiments, the heat diffusion member may include a third portion (e.g., the third diffusion portion 453 of FIG. 5) disposed to pass through the heat dissipation sheet and connecting the first portion and the second portion.

According to various embodiments of the disclosure, an electronic device may comprise a display (e.g., the display 330 of FIG. 4), a first electrical element (e.g., the electrical element 430 of FIG. 5) positioned on one side of the display to drive the display, a heat dissipation sheet (e.g., the heat dissipation sheet 401 of FIG. 5) having at least a portion disposed adjacent to the first electrical element and including a heat diffusion member and an anti-shock member disposed to be stacked with the heat diffusion member, and a bracket (e.g., the bracket 420 of FIG. 5) for providing a space to seat the heat dissipation sheet. The heat diffusion member may include a first portion (e.g., the first diffusion portion 451 of FIG. 5) disposed adjacent to the first electrical element and a second portion (e.g., the second diffusion portion 452 of FIG. 5) disposed adjacent to the bracket, in a stepped shape. The anti-shock member may include a third portion (e.g., the first member 461 of FIG. 5) and a fourth portion (e.g., the second member 462 of FIG. 5) spaced apart from each other. The third portion may be disposed between the first portion and the bracket, and the fourth portion may be disposed between the display and the second portion.

According to various embodiments of the disclosure, the heat dissipation sheet (e.g., the heat dissipation sheet 401 of FIG. 5) may include a heat diffusion member (e.g., the heat diffusion member 450 of FIG. 5) disposed adjacent to at least one electrical element to diffuse heat generated from the at least one electrical element and an anti-shock member (e.g., the anti-shock member 460 of FIG. 5) disposed to be stacked with at least a portion of the heat diffusion member. The first diffusion portion (e.g., the first diffusion portion 451 of FIG. 5) of the heat diffusion member may be disposed to face in the first direction toward the at least one electrical element, the first member of the anti-shock member may be disposed to face in the second direction opposite to the first direction, the second diffusion portion (e.g., the second diffusion portion 452 of FIG. 5) of the heat diffusion member may be disposed to face in the second direction, the second member of the anti-shock member may be disposed to face in the first direction, and the third diffusion portion (e.g., the third diffusion portion 453 of FIG. 5) of the heat diffusion member may extend from the first diffusion portion of the heat diffusion member and connect to the second diffusion portion of the heat diffusion member.

It is apparent to one of ordinary skill in the art that the heat dissipation sheet and the electronic device including the same according to various embodiments as described above are not limited to the above-described embodiments and those shown in the drawings, and various changes, modifications, or alterations may be made thereto without departing from the scope of the present invention.

What is claimed is:

1. An electronic device, comprising:
   a first electrical element;
   a heat dissipation sheet comprising a heat diffusion member and an anti-shock member disposed to be stacked with at least a portion of the heat diffusion member; and
   a bracket providing a space for receiving the heat dissipation sheet, the bracket including a first area corresponding to the first electrical element, a second area spaced apart from the first area and spaced apart from the first electrical element, and a third area disposed between the first area and the second area,
   wherein in the first area, a first diffusion portion of the heat diffusion member is disposed to face in a first direction toward the first electrical element, and a first member of the anti-shock member is disposed to face in a second direction opposite to the first direction,
   wherein in the second area, a second diffusion portion of the heat diffusion member is disposed to face in the second direction, and a second member of the anti-shock member is disposed to face in the first direction, and
   wherein a third diffusion portion of the heat diffusion member disposed in the third area extends from the heat diffusion member in the first area and connects to the heat diffusion member in the second area.

2. The electronic device of claim 1, wherein the first diffusion portion has a first size and the second diffusion portion has a second size larger than the first size, and
   wherein the first diffusion portion is disposed nearer to the first electrical element than the second diffusion portion.

3. The electronic device of claim 2, wherein the second diffusion portion of the heat diffusion member disposed in the second area of the bracket is disposed adjacent to the bracket.

4. The electronic device of claim 3, wherein a size of the first member of the anti-shock member, disposed in the first area of the bracket, corresponds to a size of the first diffusion portion,
   wherein a size of the second member of the anti-shock member, disposed in the second area of the bracket, corresponds to a size of the second diffusion portion, and
   wherein the first member and the second member are spaced apart from each other.

5. The electronic device of claim 2, wherein a first surface of the third diffusion portion of the heat diffusion member disposed in the third area of the bracket includes a predetermined slope in the first direction in which the first diffusion portion faces.

6. The electronic device of claim 5, wherein the first member and the second member are spaced apart from each other on opposite sides of the third diffusion member.

7. The electronic device of claim 5, wherein heat generated from the first electrical element is transferred to the first diffusion portion, diffused to the second diffusion portion through the third diffusion portion, and provided to the bracket, and
   wherein, of the heat generated from the first electrical element, the heat provided to an inside of the electronic device through the heat dissipation sheet is greater than the heat provided to a surface of a display assembly.

8. The electronic device of claim 1, further comprising a display assembly having at least a portion exposed to an outside in the first direction,
   wherein the first electrical element comprises a display driver IC (DDI) configured to drive the display assembly.

9. The electronic device of claim 8, wherein the heat dissipation sheet is disposed between the display assembly and the bracket, and
   wherein the first diffusion portion of the heat diffusion member disposed in the first area of the bracket is in contact with the first electrical element.

10. The electronic device of claim 8, wherein the heat dissipation sheet comprises a first surface facing in the first direction and a second surface facing in the second direction,
    wherein the first surface is formed as the heat diffusion member disposed in the first area and the third area and the anti-shock member disposed in the second area are arranged side by side, and
    wherein the second surface is formed as the heat diffusion member, disposed in the second area and the third area, and the anti-shock member disposed in the first area are arranged side by side.

11. The electronic device of claim 10, further comprising a sheet disposed on the first surface or the second surface, wherein the sheet includes at least one of an adhesive member or a release sheet.

12. The electronic device of claim 8, further comprising:
    a printed circuit board disposed under the bracket; and
    a second electrical element mounted on the printed circuit board,
    wherein the second electrical element is adjacent to the heat diffusion member in the second area.

13. The electronic device of claim 12, further comprising at least one heat conduction sheet disposed between the second electrical element and the bracket,
    wherein the at least one heat conduction sheet includes at least one of a heat pipe, a copper plate, or a vapor chamber.

14. The electronic device of claim 12, wherein the second electrical element includes at least one of a power management integrated circuit (PMIC), a power amplifier (PAM), an application processor (AP), a communication processor (CP), or a charger integrated circuit (IC).

15. The electronic device of claim 1, wherein the heat diffusion member comprises at least a portion forming a stepped shape, the heat diffusion member comprising at least one material among graphite, carbon nanotubes, a natural renewable material, silicone, and silicon.

16. The electronic device of claim 1, wherein the anti-shock member is larger in thickness than the heat diffusion member, and wherein the anti-shock member comprises a foam material.

17. An electronic device comprising:
    a display;

at least one electrical element configured to control the display;

a heat dissipation sheet disposed under the display and under the at least one electrical element and including a heat diffusion member and an anti-shock member disposed to be stacked with the heat diffusion member; and a bracket configured to support the display and to provide a space to seat at least a portion of the heat dissipation sheet, wherein the heat diffusion member includes a first diffusion portion disposed adjacent to the display, and a second diffusion portion disposed farther from the display than the first diffusion portion to be adjacent to the bracket.

18. The electronic device of claim 17, wherein the anti-shock member includes a first member corresponding to the first diffusion portion of the heat diffusion member and a second member corresponding to the second diffusion portion, and wherein the first member and the second member are spaced apart from each other.

19. The electronic device of claim 17, wherein the heat diffusion member includes a third diffusion portion disposed to pass through the heat dissipation sheet and connecting the first diffusion portion and the second diffusion portion.

* * * * *